United States Patent
Kim et al.

(10) Patent No.: US 12,262,603 B2
(45) Date of Patent: Mar. 25, 2025

(54) DISPLAY DEVICE

(71) Applicant: Samsung Display Co., LTD., Yongin-si (KR)

(72) Inventors: Sun Ho Kim, Seongnam-si (KR); Ju Chan Park, Seoul (KR); Yoo Min Ko, Suwon-si (KR); Gun Hee Kim, Seoul (KR); Tae Hoon Yang, Yongin-si (KR); Sun Hee Lee, Hwaseong-si (KR); Ja Eun Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 479 days.

(21) Appl. No.: 17/537,512

(22) Filed: Nov. 30, 2021

(65) Prior Publication Data

US 2022/0310761 A1 Sep. 29, 2022

(30) Foreign Application Priority Data

Mar. 24, 2021 (KR) .................. 10-2021-0037996

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02)

(58) Field of Classification Search
CPC .............. H10K 59/123; H10K 59/131; H10K 59/1213; H10K 59/352; H10K 59/353; H10K 59/12; G09G 3/3225
See application file for complete search history.

(56) References Cited

U.S. PATENT DOCUMENTS

| | | |
|---|---|---|
| 8,344,362 B2 | 1/2013 | Kitabayashi et al. |
| 10,084,026 B2 | 9/2018 | Nam et al. |
| 11,723,238 B2 | 8/2023 | Kim et al. |
| 2019/0305065 A1 | 10/2019 | Kim et al. |
| 2021/0208633 A1* | 7/2021 | Ma .................. G02F 1/13306 |

(Continued)

FOREIGN PATENT DOCUMENTS

| | | |
|---|---|---|
| KR | 10-2010-0043011 | 4/2010 |
| KR | 10-2017-0078177 | 7/2017 |

(Continued)

OTHER PUBLICATIONS

Korean Office Action for Korean Patent Application No. 10-2021-0037996, dated Jan. 7, 2025.

*Primary Examiner* — Moazzam Hossain
(74) *Attorney, Agent, or Firm* — KILE PARK REED & HOUTTEMAN PLLC

(57) ABSTRACT

A display device includes: a substrate having a first display area and a second display area. A first pixel circuit portion is disposed on the substrate. A first emitting diode includes a first pixel electrode connected to the first pixel circuit portion. A second pixel circuit portion is disposed on a second display area of the substrate. An extension wire is connected to the second pixel circuit portion. A second emitting diode includes a second pixel electrode connected to the extension wire, and a driving circuit portion is connected to the first pixel circuit portion and the second pixel circuit portion, and overlaps the second emitting diode. The extension wire is disposed in a different layer from the second pixel electrode.

20 Claims, 24 Drawing Sheets

(56) References Cited

U.S. PATENT DOCUMENTS

| | | | | |
|---|---|---|---|---|
| 2022/0028938 A1* | 1/2022 | Zhao | ................... | H10K 59/131 |
| 2022/0069037 A1 | 3/2022 | Kim et al. | | |
| 2022/0223652 A1* | 7/2022 | Li | ...................... | H10K 59/131 |
| 2022/0336573 A1* | 10/2022 | Chen | ................... | H10K 59/131 |
| 2023/0337480 A1 | 10/2023 | Kim et al. | | |

FOREIGN PATENT DOCUMENTS

| | | |
|---|---|---|
| KR | 10-1878189 | 7/2018 |
| KR | 10-2021-0010716 | 1/2021 |
| KR | 10-2022-0027351 | 3/2022 |

* cited by examiner

FIG. 19

DISPLAY DEVICE

CROSS-REFERENCE TO RELATED APPLICATION

This application claims priority from and the benefit of Korean Patent Application No. 10-2021-0037996, filed on Mar. 24, 2021, which is hereby incorporated by reference for all purposes as if fully set forth herein.

BACKGROUND

Field

Embodiments of the invention relate generally to a display device, and more particularly to a display device with an expanded display area.

Discussion of the Background

A display device is a device that displays a screen, and includes a liquid crystal display (LCD), an organic light emitting diode (OLED) display (OLED), and the like. Such a display device is used in various electronic devices such as portable phones, navigation devices, digital cameras, electronic books, portable game devices, or various terminals.

The display device may include a display area in which an image is displayed and a peripheral area in which the image is not displayed. A plurality of pixels may be disposed in the display area in the row direction and the column direction. Various elements such as transistors and capacitors and various wires that can supply signals to these elements can be disposed in each pixel. Various wires, scan drivers, data drivers, controllers, and the like that transmit electrical signals to drive the pixels may be disposed in the peripheral area.

Although the demand for reducing the size of the peripheral area and expanding the display area is increasing, there is a problem that it is difficult to reduce the size of the peripheral area because the area occupied by the driver increases in the process of realizing high resolution and high speed operation.

The above information disclosed in this Background section is only for understanding of the background of the inventive concepts, and, therefore, it may contain information that does not constitute prior art.

SUMMARY

Devices constructed according to embodiments of the invention are capable of providing a display device with an expanded display area.

Additional features of the inventive concepts will be set forth in the description which follows, and in part will be apparent from the description, or may be learned by practice of the inventive concepts.

A display device according to an embodiment includes: a substrate including a first display area and a second display area; a first pixel circuit portion that is disposed on the substrate; a first emitting diode that includes a first pixel electrode connected to the first pixel circuit portion; a second pixel circuit portion that is disposed on a second display area of the substrate; an extension wire that is connected to the second pixel circuit portion; a second emitting diode that includes a second pixel electrode connected to the extension wire; and a driving circuit portion that is connected to the first pixel circuit portion and the second pixel circuit portion, and overlaps the second emitting diode, wherein the extension wire is disposed in a different layer from the second pixel electrode.

The first emitting diode may overlap a first pixel circuit portion that is connected to the first emitting diode, and the second emitting diode may not overlap a second pixel circuit portion that is connected to the second emitting diode.

The substrate may include: a display area displaying an image; and a peripheral area that surrounds the display area, the display area may include the first display area and the second display area, and the second display area may be disposed between the first display area and the peripheral area.

A first part of the driving circuit portion may be disposed in the second display area, and a second part of the driving circuit portion may be disposed in the peripheral area.

The second pixel circuit portion may include: a semiconductor disposed in the second display area of the substrate; a gate electrode overlapping the semiconductor; a source electrode and a drain electrode connected to the semiconductor; and a connection electrode connected to the drain electrode, and the extension wire is connected with the connection electrode of the second pixel circuit portion.

The display device according to the embodiment may further include: an interlayer insulating layer disposed between the connection electrode and the extension wire; a protective layer that is disposed on the extension wire and the connection electrode and includes an opening that overlaps the extension wire and the connection electrode; and a bridge electrode that is disposed in the opening, and connects between the extension wire and the connection electrode.

The bridge electrode may be disposed in the same layer as the second pixel electrode.

The bridge electrode may be disposed in the same layer as the first pixel electrode, and the extension wire may be disposed in a different layer from the first pixel electrode.

The interlayer insulating layer may have the same planar shape as the extension wire.

The interlayer insulating layer may be formed by simultaneously patterning the extension wire using the same mask.

The interlayer insulating layer may be disposed in the second display area, and may not be disposed in the first display area.

The display device according to the embodiment may further include a plurality of second emitting diodes connected to the second pixel circuit portion.

The plurality of second emitting diodes may include: a plurality of second pixel electrodes disposed on the protective layer and connected to the extension wire; a plurality of emission layers respectively disposed on the plurality of second pixel electrodes; and a common electrode disposed on the plurality of emission layers.

The display device according to the embodiment may further include: an interlayer insulating layer that is disposed between the connection electrode and the extension wire; and a protective layer that is disposed between the extension wire and the second pixel electrode, wherein the interlayer insulating layer may be disposed on the entire substrate.

The extension wire may be directly connected with the connection electrode.

The interlayer insulating layer may be disposed on the first display area and the second display area of the substrate.

The display device according to the embodiment may further include a plurality of second emitting diodes connected to the second pixel circuit portion.

The plurality of second emitting diodes may include: a plurality of second pixel electrodes disposed on the protective layer and connected to the extension wire; a plurality of emission layers respectively disposed on the plurality of second pixel electrodes; and a common electrode disposed on the plurality of emission layers.

The display device according to the embodiment may further include a shield electrode disposed between the second pixel circuit portion and the driving circuit portion.

The shield electrode may be applied with a constant voltage.

According to the embodiments, a display device with an expanded display area can be provided. Additionally, when the second pixel circuit portion and the second emitting diode are connected through the extension wire disposed on a different layer from the pixel electrode of the second emitting diode, the wiring can be simplified and short circuit failure can be prevented.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

FIG. 19 shows an alignment form of second pixel circuit portions and an alignment form of second emitting diodes of the display device according to the embodiment.

DETAILED DESCRIPTION

Figure 1:
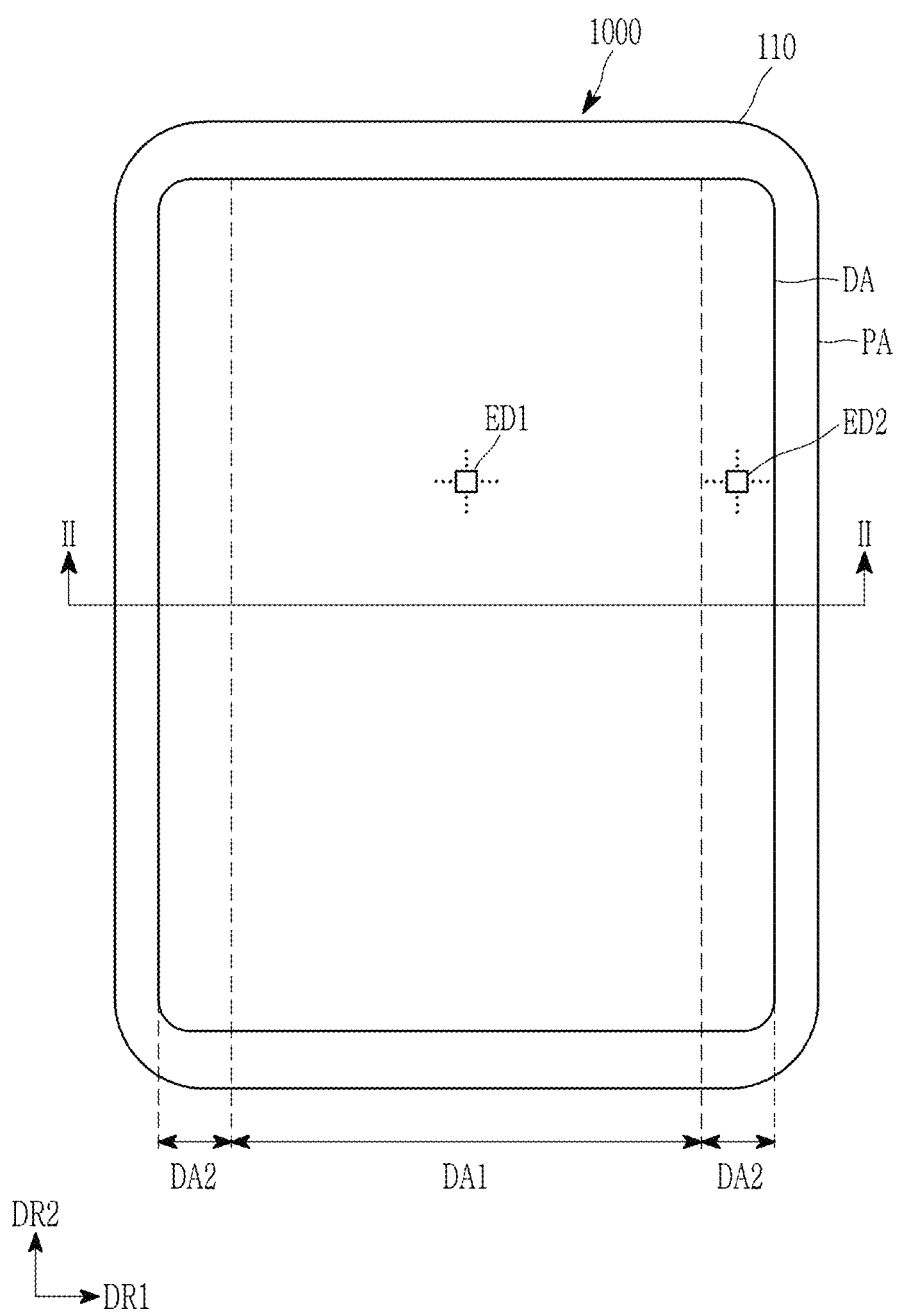
FIG. 1 is a top plan view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z — axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Further, throughout the specification, the phrase "on a plane" means viewing a target portion from the top, and the phrase "on a cross-section" means viewing a cross-section formed by vertically cutting a target portion from the side.

First, a display device according to an embodiment of the inventive concepts will be described with reference to FIG. 1 and FIG. 2.

Figure 2:
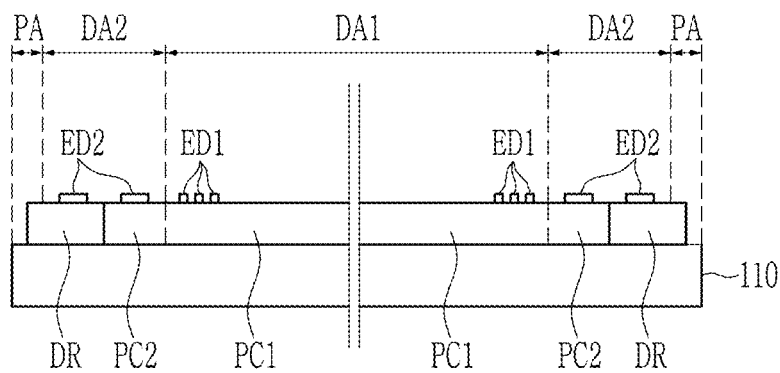
FIG. 2 is a cross-sectional view of FIG. 1, taken along the line II-II.

FIG. 1 is a top plan view of a display device according to an embodiment, and FIG. 2 is a cross-sectional view of FIG. 1, taken along the line II-II.

As shown in FIG. 1 and FIG. 2, a display device 1000 according to an embodiment includes a substrate 110 and emitting diodes ED1 and ED2 that are disposed on the substrate 110.

The substrate 110 includes a display area DA and a peripheral area PA that is adjacent to the display area DA.

The display area DA may be disposed in a center of the display device 1000, may have a substantially rectangular shape, and each corner may have a rounded shape. However, the shape of the display area DA and the shape of the corner are not limited thereto, and may be variously changed. The display area DA may include a first display area DA1 and second display areas DA2 that are adjacent to the first display area DA1. The first display area DA1 may be disposed in a center of the display area DA, and the second display area DA2 may be disposed on both sides of the first display area DA1, for example, left and right. However, this is only an example, and the positions of the first display area DA1 and the second display area DA2 may be variously changed. For example, the first display area DA1 may be formed in an approximately quadrangle shape, and the second display area DA2 may be disposed so as to surround the four corners of the first display area DA1.

The peripheral area PA may be formed to surround the display area DA. The peripheral area PA is an area in which an image is not displayed, and may be disposed on an outer side of the display device 1000.

At least a part of the display device according to the embodiment may include a bent portion that can be bent. For example, a center portion of the display device 1000 may be flat, and edge portions of the display device 1000 may be bent. In this case, at least a part of the second display area DA2 may be disposed in the bent portion. That is, at least a part of the second display area DA2 of the substrate 110 may be bent.

The emitting diodes ED1 and ED2 may emit a predetermined light. For example, the emitting diodes ED1 and ED2 may emit light of red, green, and blue, or white. The display device 1000 may display a predetermined image through light emitted from the emitting diodes ED1 and ED2. The emitting diodes ED1 and ED2 may include a first emitting diode ED1 and a second emitting diode ED2. The emitting diodes ED1 and ED2 may be disposed in the display area DA. The first emitting diode ED1 may be disposed in the first display area DA1, and the second emitting diode ED2 may be disposed in the second display area DA2. Although it is not illustrated, the display device 1000 according to the embodiment may include plurality of first emitting diodes ED1 and a plurality of second emitting diodes ED2. The plurality of first emitting diodes ED1 may be arranged in the first display area DA1 along a first direction DR1 and a second direction DR2, and the plurality of second emitting diodes ED2 may be arranged in the second display area DA2 along the first direction DR1 and the second direction DR2. The size of the first emitting diode ED1 and the size of the second emitting diode ED2 may be the same or different. For example, the size of the second emitting diode ED2 may be larger than the size of the first emitting diode ED 1. The number of first emitting diodes ED1 per unit area and the number of second emitting diodes ED2 per unit area may be the same or different. For example, the number of second emitting diodes ED2 per unit area may be less than the number of first emitting diodes ED1 per unit area. The resolution of the first display area DA1 and the resolution of the second display area DA2 may be the same or different. For example, the resolution of the first display area DA1 may be higher than that of the second display area DA2. The alignment form, size, and resolution of the first display area DA1 and the second display area DA2 of the first emitting diode ED1 and the second emitting diode ED2 are not limited thereto, and may be variously changed.

The display device 1000 according to the embodiment may further include pixel circuit portions PC1 and PC2 disposed on the substrate 110. The pixel circuit portions PC1 and PC2 may include a first pixel circuit portion PC1 and a second pixel circuit portion PC2. The display device 1000 according to the embodiment may include a plurality of first pixel circuit portions PC1 and a plurality of second pixel circuit portions PC2. The first pixel circuit portion PC1 substantially indicates an area where the plurality of first pixel circuit portions PC1 are arranged along the first direction DR1 and the second direction DR2, and the second pixel circuit portion PC2 substantially indicates an area where the plurality of second pixel circuit portions PC2 are arranged in the first direction DR1 and the second direction DR2. The arrangement form of the plurality of pixel circuit portions PC1 and PC2 is not particularly limited, and they may be arranged in various forms. The first pixel circuit portion PC1 may be disposed in the first display area DA1, and the second pixel circuit portion PC2 may be disposed in the second display area DA2. Each of the pixel circuit portions PC1 and PC2 may be connected to one of the emitting diodes ED1 and ED2. The first pixel circuit portion PC1 may be connected with the first emitting diode ED1, and the second pixel circuit portion PC2 may be connected with the second emitting diode ED2. The size of one first pixel circuit portion PC1 and the size of one second pixel circuit portion PC2 may be the same or different. For example, the size of one second pixel circuit portion PC2 may be larger than the size of one first pixel circuit portion PC1. In addition, the structure of the first pixel circuit portion PC1 and the structure of the second pixel circuit portion PC2 may be different.

The display device 1000 according to the embodiment may further include a driving circuit portion DR disposed on the substrate 110. The driving circuit portion DR may be connected to the first pixel circuit portion PC1 and the second pixel circuit portion PC2. The driving circuit portion DR may include a plurality of driver and signal wires. For example, the driving circuit portion DR may include a scan driver, data driver, a driving voltage supply line, a common voltage supply line, and signal transmission wires connected to the scan driver, the data driver, the driving voltage supply line, and the common voltage supply line. The scan driver generates a scan signal and transmits the scan signal to the pixel circuit portions PC1 and PC2 through a scan line. The data driver generates a data signal and transmits the data signal to the pixel circuit portions PC1 and PC2 through a data line. The driving voltage supply line transmits a driving voltage to the pixel circuit portions PC1 and PC2. The common voltage supply line transmits a common voltage to one electrode of the emitting diodes ED1 and ED2. At least a part of the driving circuit portion DR may be disposed in the second display area DA2, and the remaining portion may be disposed in the peripheral area PA.

In the first display area DA1, the first pixel circuit portion PC1 may be electrically connected with the first emitting diode ED1 disposed on the first pixel circuit portion PC1. In this case, a light emission area of the first emitting diode ED1 may overlap the first pixel circuit portion PC1 that is connected thereto. The first display area DA1 is an area from which light is emitted by the first emitting diode ED1.

In the second display area DA2, the second pixel circuit portion PC2 may be connected with the second emitting diode ED2 that is disposed at a predetermined distance therefrom. In this case, a light emitting area of the second emitting diode ED2 may not overlap the second pixel circuit portion PC2 that is connected thereto. The light emitting area of the second emitting diode ED2 may overlap with the second pixel circuit portion PC2 that is not connected thereto. The light emitting area of the second emitting diode ED2 may overlap the driving circuit portion DR. The light emitting areas of some second emitting diodes ED2 may overlap with the second pixel circuit portion PC2 connected thereto. The second display area DA2 is an area from which light is emitted by the second emitting diode ED2.

In a general display device, the pixel circuit portion and emitting diode are disposed in the display area, the driving circuit portion is disposed in the peripheral area surrounding the display area, and the pixel circuit portion and emitting diode are not disposed. Accordingly, light is not emitted from the peripheral area where the driving circuit portion is disposed, and a dead space is formed. In the display device according to the embodiment, the second emitting diode ED2 is disposed at a portion where the driving circuit portion DR is disposed to emit light, thereby expanding a region in which a screen is displayed. That is, the dead space can be reduced and the bezel can be reduced by positioning the second emitting diode ED2 on the driving circuit portion DR.

Hereinafter, a connection relationship between each pixel circuit portion and an emitting diode of the display device according to the embodiment will be described with reference to FIG. 3 to FIG. 5.

Figure 3:
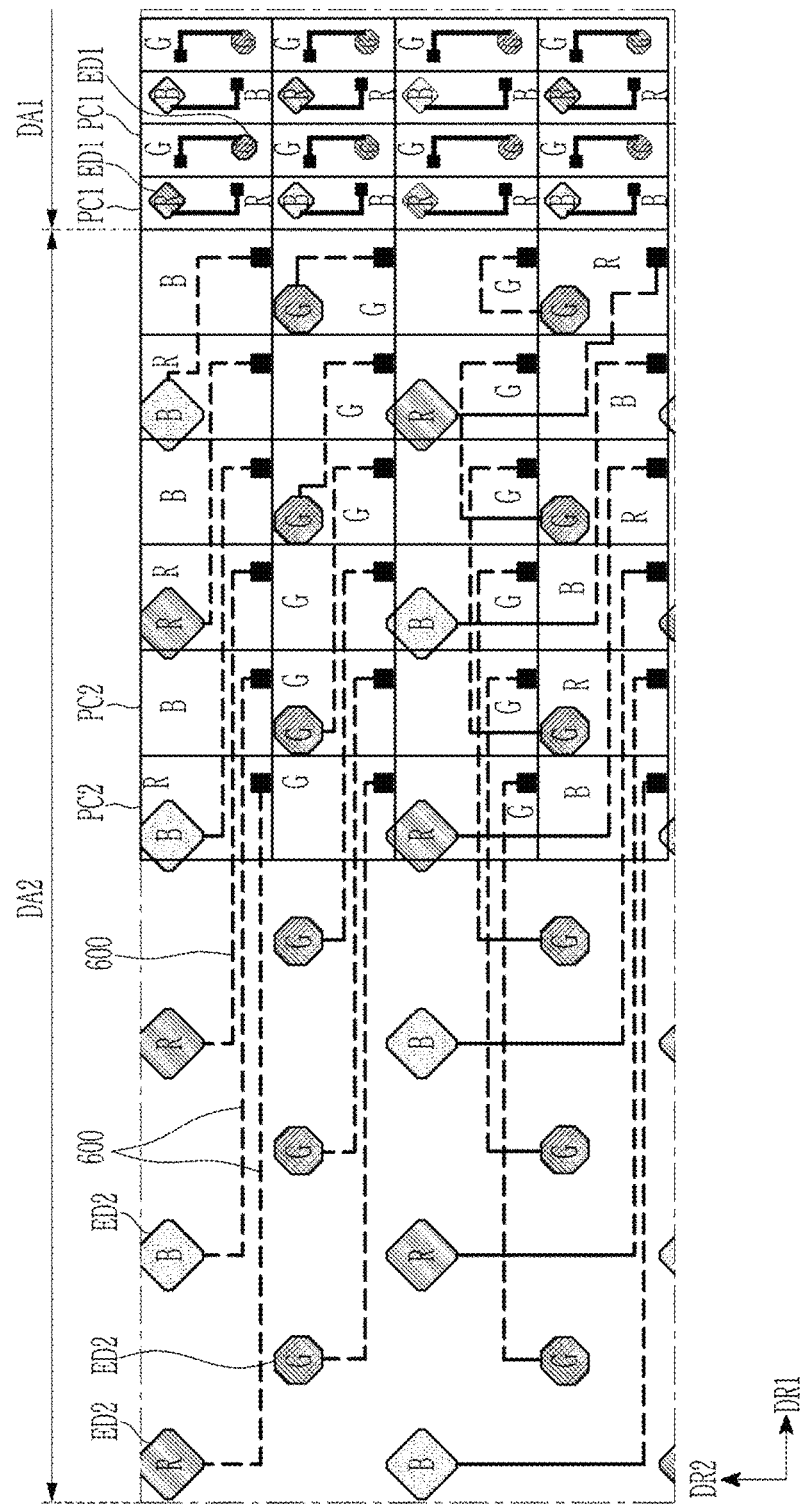
FIG. 3 is a top plan view of a connection relationship between the pixel circuit portion and the light emitting element of the display device according to the embodiment.
Figure 4:
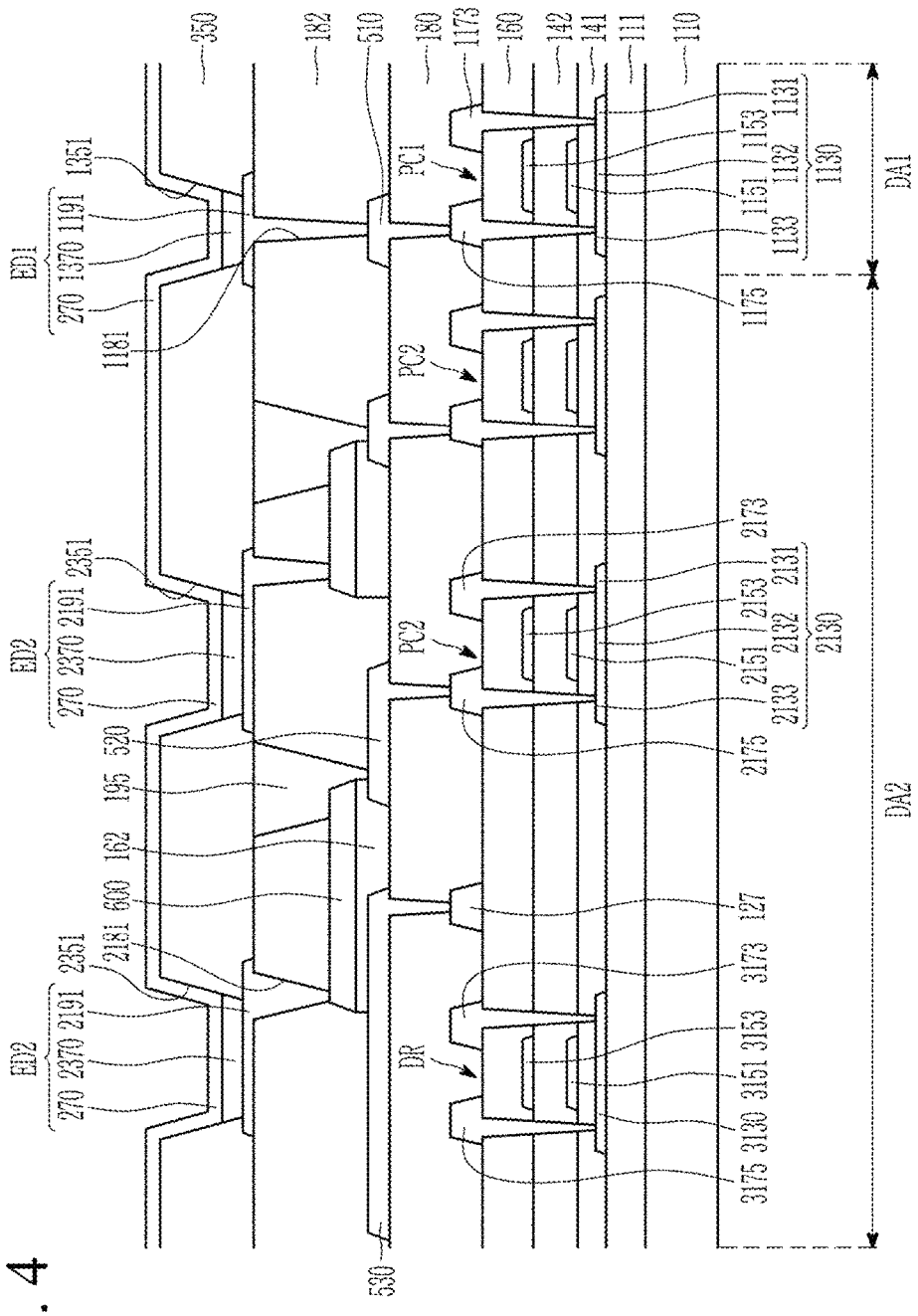
FIG. 4 is a cross-sectional view of a part of the display device according to the embodiment.
Figure 5:
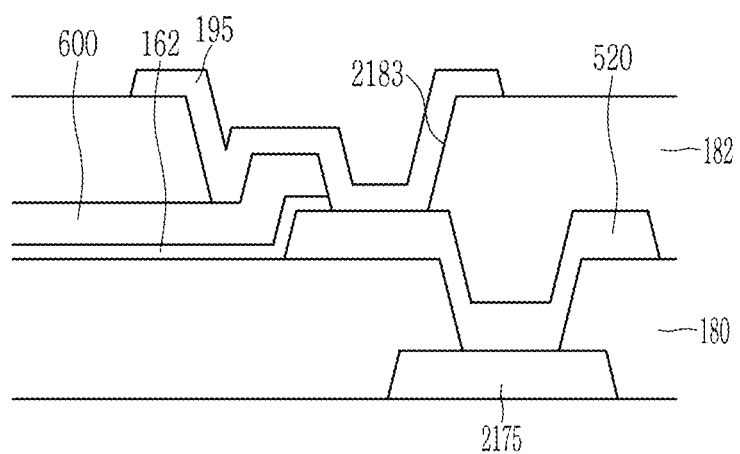
FIG. 5 is a cross-sectional view of enlarged some layers of some area of FIG. 4.

FIG. 3 is a top plan view of a connection relationship between the pixel circuit portion and the light emitting element of the display device according to the embodiment, FIG. 4 is a cross-sectional view of a part of the display device according to the embodiment, and FIG. 5 is a cross-sectional view of enlarged some layers of some area of FIG. 4.

First, as shown in FIG. 3 and FIG. 4, the light emitting area of the first emitting diode ED1 of the display device according to the embodiment overlaps the first pixel circuit portion PC1 that is connected with the first emitting diode ED1.

The first pixel circuit portion PC1 includes a semiconductor 1130 disposed on the first display area DA1 of the substrate 110, a gate electrode 1151, a source electrode 1173, and a drain electrode 1175.

The substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate 110 may contain a flexible material that can be bent or folded, and may be single-layered or multi-layered.

A buffer layer 111 may be disposed on the substrate 110. The buffer layer 111 may have a single-layered or multi-layered structure. The buffer layer 111 may include an inorganic insulating material such as a silicon nitride ($SiN_Y$), a silicon oxide ($SiO_X$), and a silicon oxynitride ($SiO_XN_Y$), or an organic insulating material. The buffer layer 111 may be omitted as necessary. In addition, a barrier layer may further be disposed between the substrate 110 and the buffer layer 111. The barrier layer may have a single-layer or multi-layer structure. The barrier layer may include an inorganic insulating material such as a silicon nitride ($SiN_Y$), a silicon oxide ($SiO_X$), a silicon oxynitride ($SiO_XN_Y$), and the like.

A semiconductor layer including the semiconductor 1130 of the first pixel circuit portion PC1 may be disposed on the buffer layer 111. The semiconductor 1130 may include a first region 1131, a channel 1132, and a second region 1133. The first region 1131 and the second region 1133 may be respectively disposed at opposite sides of the channel 1132 of the semiconductor 1130 of the first pixel circuit portion PC1. The semiconductor 1130 of the first pixel circuit portion PC1 may include a semiconductor material such as amorphous silicon, a polysilicon, an oxide semiconductor, and the like.

A first gate insulating layer 141 may be disposed on the semiconductor 1130 of the first pixel circuit portion PC1. The first gate insulating layer 141 may have a single-layer or multi-layer structure. The first gate insulating layer 141 may include an inorganic insulating material such as a silicon nitride ($SiN_Y$), a silicon oxide ($SiO_X$), a silicon oxynitride ($SiO_XN_Y$), and the like.

A first gate conductive layer that includes the gate electrode 1151 of the first pixel circuit portion PC1 may be disposed on the first gate insulating layer 141. The gate electrode 1151 of the first pixel circuit portion PC1 may overlap the channel 1132 of the semiconductor 1130. The first gate conductive layer may have a single-layer or multi-layer structure. The first gate conductive layer may include may include a metallic material such as molybdenum (Mo), aluminum (Al), copper (Cu), and/or titanium (Ti). After forming the first gate conductive layer, a doping process or plasma treatment may be performed. A portion of the semiconductor layer, covered by the first gate conductive layer, is not doped or plasma treated, and a portion of the semiconductor layer, not covered by the first gate conductive layer, is doped or plasma treated and thus it may have the same characteristic as a conductor.

A second gate insulating layer 142 may be disposed on the first gate conductive layer including the gate electrode 1151 of the first pixel circuit portion PC1. The second gate insulating layer 142 may have a single-layer or multi-layer structure. The second gate insulating layer 142 may include an inorganic insulating material such as a silicon nitride ($SiN_Y$), a silicon oxide ($SiO_X$), a silicon oxynitride ($SiO_XN_Y$), and the like.

A second gate conductive layer that includes a first sustain electrode 1153 may be disposed on the second gate insulating layer 142. The second gate conductive layer may have a single-layer or multi-layer structure. The second gate conductive layer may include a metallic material such as molybdenum (Mo), aluminum (Al), copper (Cu), and/or titanium (Ti). The first sustain electrode 1153 forms a sustain capacitor by overlapping the gate electrode 1151.

A first interlayer insulating layer 160 may be disposed on the second gate conductive layer that includes the first sustain electrode 1153. The first interlayer insulating layer 160 may have a single-layer or multi-layer structure. The first interlayer insulating layer 160 may include an inorganic insulating material or an organic insulating material.

A first data conductive layer that includes the source electrode 1173 and the drain electrode 1175 of the first pixel circuit portion PC1 may be disposed on the first interlayer insulating layer 160. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The first interlayer insulating layer 160 may include an opening that overlaps the source electrode 1173 of the first pixel circuit portion PC1 and the first region 1131 of the semiconductor 1130. The source electrode 1173 of the first pixel circuit portion PC1 may be connected with the first region 1131 of the semiconductor 1130 through the opening. The first interlayer insulating layer 160 may include an opening that overlaps the drain electrode 1175 of the first pixel circuit portion PC1 and the second region 1133 of the semiconductor 1130. The drain electrode 1175 of the first pixel circuit portion PC1 may be connected with the second region 1133 of the semiconductor 1130 through the opening.

A first protective layer 180 may be disposed on the first data conductor layer that includes the source electrode 1173 and the drain electrode 1175 of the first pixel circuit portion is PC1. The first protective layer 180 may include an inorganic insulating material such as a silicon nitride ($SiN_Y$), a silicon oxide ($SiO_X$), a silicon oxynitride ($SiO_XN_Y$), and the like and/or an organic insulating material such as a polyimide, an acryl-based polymer, a siloxane-based polymer, and the like.

A second data conductive layer that includes the connection electrode 510 of the first pixel circuit portion PC1 may be disposed on the first protective layer 180. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), potassium (Ca), molybdenum (Mo), titanium (Ti), tungsten (W), and/or copper (Cu).

The first protective layer 180 may include an opening that overlaps the drain electrode 1175 of the first pixel circuit portion PC1. The connection electrode 510 of the first pixel circuit portion PC1 may be connected with the drain electrode 1175 through the opening.

A second protective layer 182 may be disposed on the second data conductive layer that includes the connection electrode 510 of the first pixel circuit portion PC1. The second protective layer 182 may contain an organic insulating material such as general-purpose polymers such as polymethylmethacrylate (PMMA) or polystyrene (PS), polymer derivatives having phenolic groups, acryl-based polymers, imide-based polymers, polyimide, acryl-based polymers, siloxane-based polymers, and the like.

A first emitting diode ED1 connected with the first pixel circuit portion PC1 may be disposed on the second protective layer 182. The first emitting diode ED1 may include a pixel electrode 1191, an emission layer 1370, and a common electrode 270.

The pixel electrode 1191 of the first emitting diode ED1 may be disposed on the second protective layer 182. The second protective layer 182 may include an opening that overlaps the pixel electrode 1191 of the first emitting diode ED1 and the connection electrode 510 of the first pixel circuit portion PC1. The pixel electrode 1191 of the first emitting diode ED1 may be connected with the connection electrode 510 of the first pixel circuit portion PC1 through the opening 1181. Thus, the pixel electrode 1191 of the first emitting diode ED1 may be connected with the drain electrode 1175 of the first pixel circuit portion PC1 through the connection electrode 510.

A partitioning wall 350 may be disposed on the pixel electrode 1191 of the first emitting diode ED1. A pixel opening 1351 is formed in the partitioning wall 350, and the pixel opening 1351 of the partitioning wall 350 may overlap the pixel electrode 1191.

An emission layer 1370 of the first emitting diode ED1 may be disposed in the pixel opening 1351 of the partitioning wall 350. The emission layer 1370 may overlap the pixel electrode 1191.

A common electrode 270 may be disposed on the emission layer 1370 and the partitioning wall 350.

The first emitting diode ED1 emits light around a region where the pixel electrode 1191, the emission layer 1370, and the common electrode 270 overlap, and a light emitting region of the first emitting diode ED1 overlaps with the first pixel circuit portion PC1 connected thereto.

In the first display area DA1, the first pixel circuit portion PC1 and the first emitting diode ED1 are respectively arranged in a matrix format along a first direction DR1 and a second direction DR2. In this case, a pixel circuit portion PC1 disposed at a first row and a first column is connected to the first emitting diode ED1, while overlapping the first emitting diode ED 1. A pixel circuit portion PC1 disposed at the first row and a second column is connected with the first emitting diode ED1, while overlapping the first emitting diode ED 1. A pixel circuit portion PC1 disposed at a second row and the first column is connected with the first emitting diode ED1, while overlapping the first emitting diode ED1. A pixel circuit portion PC1 disposed at the second row and the second column is connected with the first emitting diode ED1, while overlapping the first emitting diode ED1.

In this case, the first emitting diode ED1 may display at least one of a first color, a second color, and a third color. For example, the first emitting diode ED1 may display red R, green G, and blue B colors. In this case, a first emitting diode ED1 displaying red R, a first emitting diode ED1 displaying green G, a first emitting diode ED1 displaying blue B, and a first emitting diode ED1 displaying green G may be repeatedly disposed in the first row and the third row. A first emitting diode ED1 displaying blue B, a first emitting diode ED1 displaying green G, a first emitting diode ED1 display-ing red R, and a first emitting diode ED1 displaying green G may be repeatedly disposed in a second row and a fourth row.

A light emitting region of the second emitting diode ED2 of the display device according to the embodiment may or may not overlap the second pixel circuit portion PC2 connected to the second emitting diode ED2. A part of the plurality of second emitting diodes ED2 may overlap the second pixel circuit portion PC2 connected with the second emitting diode ED2. Another part of the plurality of second emitting diodes ED2 may overlap the driving circuit portion DR.

The second pixel circuit portion PC2 may include a semiconductor 2130, a gate electrode 2151, a source electrode 2173, and a drain electrode 2175 disposed on the second display area DA2 of the substrate 110. The driving circuit portion DR may include a semiconductor 3130, a gate electrode 3151, a source electrode 3173, and a drain electrode 3175 disposed on the second display area DA2 of the substrate 110.

A buffer layer 111 may be disposed on the substrate 110, the semiconductor 2130 of the second pixel circuit portion PC2, and the semiconductor 3130 of the driving circuit portion DR may be disposed on the buffer layer 111. The semiconductor 2130 of the second pixel circuit portion PC2 and the semiconductor 3130 of the driving circuit portion DR may be disposed in the semiconductor layer.

A first gate insulating layer 141 may be disposed on the semiconductor 2130 of the second pixel circuit portion PC2 and the semiconductor 3130 of the driving circuit portion DR, and the gate electrode 2151 of the second pixel circuit portion PC2 and the gate electrode 3151 of the driving circuit portion DR may be disposed on the first gate insulating layer 141. The semiconductor 2130 of the second pixel circuit portion PC2 and the semiconductor 3130 of the driving circuit portion DR may be disposed in the first gate conductive layer. The gate electrode 2151 of the second pixel circuit portion PC2 may overlap the channel 2132 of the semiconductor 2130.

The second gate insulating layer 142 may be disposed on the gate electrode 2151 of the second pixel circuit portion PC2 and the gate electrode 3151 of the driving circuit portion DR, and a first sustain electrode 2153 of the second pixel circuit portion PC2 and a first sustain electrode 3153 of the driving circuit portion DR may be disposed on the second gate insulating layer 142. The first sustain electrode 2153 of the second pixel circuit portion PC2 may overlap the gate electrode 2151 of the second pixel circuit portion PC2. The first sustain electrode 3153 of the driving circuit portion DR may overlap the gate electrode 3151 of the driving circuit portion DR.

A first interlayer insulating layer 160 may be disposed on the first sustain electrode 2153 of the second pixel circuit portion PC2 and the first sustain electrode 3153 of the driving circuit portion DR. The source electrode 2173 and the drain electrode 2175 of the second pixel circuit portion PC2 and the source electrode 3173 and the drain electrode 3175 of the driving circuit portion DR may be disposed on the first interlayer insulating layer 160. The source electrode 2173 and the drain electrode 2175 of the second pixel circuit portion PC2 and the source electrode 3173 and the drain electrode 3175 of the driving circuit portion DR may be disposed in the first data conductive layer.

The first interlayer insulating layer 160 may include an opening 2161 that overlaps the source electrode 2173 of the second pixel circuit portion PC2 and the first region 2131 of the semiconductor 2130. The source electrode 2173 of the second pixel circuit portion PC2 may be connected with the first region 2131 of the semiconductor 2130 through the opening 2161. The first interlayer insulating layer 160 may include an opening 2162 that overlaps the drain electrode 2175 of the second pixel circuit portion PC2 and the second region 2133 of the semiconductor 2130

The drain electrode 2175 of the second pixel circuit portion PC2 may be connected with the second region 2133 of the semiconductor 2130 through the opening 2162. Similarly, the source electrode 3173 of the driving circuit portion DR may be connected to a first region of the semiconductor 3130, and the drain electrode 3175 may be connected to a second region of the semiconductor 3130.

The first data conductive layer may further include an initialization voltage line 127. The initialization voltage line 127 may transmit an initialization voltage Vint. The initialization voltage Vint is formed as a constant voltage. That is, a constant voltage is applied to the initialization voltage line 127.

The first protective layer 180 may be disposed on the source electrode 2173 and the drain electrode 2175 of the second pixel circuit portion PC2 and the source electrode 3173 and the drain electrode 3175 of the driving circuit portion DR.

The connection electrode 520 of the second pixel circuit portion PC2 may be disposed on the first protective layer 180. The connection electrode 520 of the second pixel circuit portion PC2 may be disposed in the second data conductive layer. The first protective layer 180 may include an opening that overlaps the drain electrode 2175 of the second pixel circuit portion PC2. The connection electrode 520 of the second pixel circuit portion PC2 may be connected with the drain electrode 2175 through the opening.

The second data conductive layer may further include a shield electrode 530. The first protective layer 180 may include an opening that overlaps the initialization voltage line 127. The shield electrode 530 may be connected with the initialization voltage line 127 through the opening. The shield electrode 530 may overlap the driving circuit portion DR, and may cover the driving circuit portion DR. The shield electrode 530 may receive the initialization voltage Vint through the initialization voltage line 127.

The shield electrode 530 may be disposed between the driving circuit portion DR and the second emitting diode ED2. The second emitting diode ED2 may overlap the driving circuit portion DR, and may be affected by the voltage applied to the driving circuit portion DR. In the display device according to the embodiment, the effect of the driving circuit portion DR on the second emitting diode ED2 may be shielded by the shield electrode 530 to which a constant voltage such as the initialization voltage Vint is applied. It has been described above that the shield electrode 530 is connected to the initialization voltage line 127, but is not limited thereto. The shield electrode 530 may be connected to another wire, and a constant voltage may be applied to the shield electrode 530. For example, the shield electrode 530 may be connected to a wire to which a common voltage ELVSS is applied.

A second interlayer insulating layer 162 may be disposed on the connection electrode 520 of the second pixel circuit portion PC2. A part of the connection electrode 520 of the second pixel circuit portion PC2 may be covered by the second interlayer insulating layer 162, and another part of the connection electrode 520 of the second pixel circuit portion PC2 may be covered by the second protective layer 182.

An extension wire 600 may be disposed on the second interlayer insulating layer 162. The extension wire 600 may be connected to the connection electrode 520 of the second pixel circuit portion PC2, and a connection relationship therebetween will be described in more detail with reference to FIG. 5. The extension wire 600 and the second interlayer insulating layer 162 may be simultaneously patterned by using the same mask. Thus, the extension wire 600 may have a planar shape substantially equivalent to the second interlayer insulating layer 162. The extension wire 600 may be disposed only in the second display area DA2 and may not be disposed in the first display area DA1. The second interlayer insulating layer 162 may also be disposed only in the second display area DA2 and may not be disposed in the first display area DA1. Thus, the second interlayer insulating layer 162 may at least partially overlap the second pixel circuit portion PC2 and the second emitting diode ED2, and may not overlap the first pixel circuit portion PC1 and the first emitting diode ED1 at all. By simultaneously patterning the extension wire 600 and the second interlayer insulating layer 162, the number of masks used in the process of manufacturing the display device according to the embodiment can be reduced. Accordingly, it is possible to reduce process cost, time, and the like. The extension wire 600 may overlap a portion of an edge of the connection electrode 520 of the second pixel circuit portion PC2. The second interlayer insulating layer 162 is disposed between the extension wire 600 and the connection electrode 520 of the second pixel circuit portion PC2, and the extension wire 600 and the connection electrode 520 of the second pixel circuit portion PC2 are not directly connected to each other. The extension wire 600 may also overlap the shield electrode 530. The second interlayer insulating layer 162 is disposed between the extension wire 600 and the shield electrode 530. The extension wire 600 and the shield electrode 530 may be insulated by the second interlayer insulating layer 162.

The second protective layer 182 is disposed on the connection electrode 520 of the second pixel circuit portion PC2 and the extension wire 600. The second protective layer 182 includes an overlapping portion of the connection electrode 520 and the extension wire 600 of the second pixel circuit portion PC2, and an opening 2183 overlapping the periphery thereof. A bridge electrode 195 may be disposed on the second protective layer 182. The bridge electrode 195 may be disposed on the same layer as the pixel electrode 1191 of the first emitting diode ED1. The bridge electrode 195 is disposed in the opening 2183, and may be connected to the connection electrode 520 of the second pixel circuit portion PC2 and the extension wire 600 in the opening 2183. Accordingly, the extension wire 600 and the connection electrode 520 of the second pixel circuit portion PC2 may be connected by the bridge electrode 195.

The second emitting diode ED2 connected to the second pixel circuit portion PC2 may be disposed on the second protective layer 182. The second emitting diode ED2 may include a pixel electrode 2191, an emission layer 2370, and a common electrode 270.

The pixel electrode 2191 of the second emitting diode ED2 may be disposed on the second protective layer 182. The pixel electrode 2191 of the second emitting diode ED2 may be disposed on the same layer as the pixel electrode 1191 of the first emitting diode ED1 and the bridge electrode 195. The second protective layer 182 may include an opening 2181 overlapping the pixel electrode 2191 of the second emitting diode ED2 and the extension wire 600. The pixel electrode 2191 of the second emitting diode ED2 may be connected to the extension wire 600 through the opening 2181. The extension wire 600 may be connected to the second pixel circuit portion PC2 through the bridge electrode 195. Accordingly, the extension wire 600 may connect between the second pixel circuit portion PC2 and the second emitting diode ED2. The second emitting diode ED2 may be far apart from the second pixel circuit portion PC2 connected to the second emitting diode ED2 without overlapping it. The extension wire 600 may connect the second emitting diode ED2 and the second pixel circuit portion PC2 that are spaced apart from each other.

For comparison with the display device according to the embodiment, a display device according to a reference example, which does not include an extension wire, may be considered. In the display device according to the reference example, a pixel electrode 2191 of a second emitting diode ED2 may be extended to be connected to a second pixel circuit portion PC2 that is disposed far away. In this case, the pixel electrode 2191 may extend long, and it may cause complication in a process of designing the pixel electrode 2191 to bypass to thereby prevent collision with adjacent pixels, and short circuit defects may occur. In the display device according to the embodiment, the second pixel circuit portion PC2 and the second emitting diode ED2 are connected through the extension wire 600 disposed on a different layer from the pixel electrode 2191 of the second emitting diode ED2, and thus wiring can be simplified and short circuit failure can be prevented.

The partitioning wall 350 may be disposed on the pixel electrode 2191 of the second emitting diode ED2. A pixel opening 2351 is formed in the partitioning wall 350, and the pixel opening 2351 of the partitioning wall 350 may overlap the pixel electrode 2191.

The emission layer 2370 of the second emitting diode ED2 may be disposed within the pixel opening 2351 of the partitioning wall 350. The emission layer 2370 may overlap the pixel electrode 2191.

The common electrode 270 may be disposed on the emission layer 2370 and the partitioning wall 350. The common electrode 270 of the second emitting diode ED2 and the common electrode 270 of the first emitting diode ED1 may be formed integrally, and may be entirely disposed in most regions on the substrate 110.

The second emitting diode ED2 emits light around a region where the pixel electrode 2191, the emission layer 2370, and the common electrode 270 overlap, and the light emitting region of the second emitting diode ED2 may or may not overlap with the second pixel circuit portion PC2 connected thereto.

In the second display area DA2, the second pixel circuit portion PC2 and the second emitting diode ED2 are disposed in a matrix format along the first direction DR1 and the second direction DR2, respectively. In this case, the second pixel circuit portion PC2 disposed in the first row and first column may be connected with the second emitting diode ED2 disposed in the first row and first column, but they do not overlap each other. That is, a light emitting region of the second emitting diode ED2 may not overlap a second pixel circuit portion PC2 connected thereto. The second emitting diode ED2 and the second pixel circuit portion PC2 spaced apart from each other without overlapping may be connected by an extension wire 600.

In addition, the second pixel circuit portion PC2 disposed in the first row and second column is connected with the second emitting diode ED2 disposed in the first row and second column, but a light emitting region of the second emitting diode ED2 does not overlap a second pixel circuit portion PC2 connected thereto. In addition, the second pixel circuit portion disposed in the second row and first column is connected with the second emitting diode ED2 disposed in the second row and first column, but does not overlap a second pixel circuit portion PC2 connected thereto. In addition, the second pixel circuit portion PC2 disposed in the second row and second column is connected with the second emitting diode ED2 disposed in the second row and second column, but does not overlap a second pixel circuit portion PC2 connected thereto.

However, some light emitting regions of the second emitting diode ED2 may overlap with the second pixel circuit portion PC2 that is not connected thereto. For example, a light emitting region of the second emitting diode ED2 disposed in the first row and fourth column may overlap the second pixel circuit portion PC2 disposed in the first row and first column. In addition, a light emitting region of the second emitting diode ED2 disposed in the first row and fifth column may overlap the second pixel circuit portion PC2 disposed in the first row and third column. In addition, a light emitting region of the second emitting diode ED2 disposed in the first row and sixth column may overlap the second pixel circuit portion PC2 disposed in the first row and fifth column.

In addition, light emitting regions of some second emitting diode ED2 may overlap with the second pixel circuit portion PC2 connected thereto. For example, a light emitting region of the second emitting diode ED2 disposed in the second row and sixth column may overlap the second pixel circuit portion PC2 disposed in the second row and sixth column.

In this case, each of the second emitting diodes ED2 may display at least one of a first color, a second color, and a third color. For example, the second emitting diode ED2 may include red R, green G, and blue B colors. In this case, the second emitting diode ED2 displaying red R and the second emitting diode ED2 displaying blue B may be iteratively disposed in the first and third rows. The second emitting diode ED2 displaying green G may be disposed in the second and fourth rows.

In the display device according to the embodiment, the second emitting diode ED2 is disposed not only in the region where the second pixel circuit portion PC2 is disposed but also in a region where the driving circuit portion DR is disposed, thereby expanding a region where the screen is displayed. Accordingly, the pixel density in the second display area DA2 may be relatively lower than the pixel density in the first display area DA1. In this case, the size of the second emitting diode ED2 may be increased to increase the luminance of the second emitting diode ED2 to compensate for the decreased pixel density. Accordingly, in order to supply more current to the second emitting diode ED2, the size of each element such as a storage capacitor included in the second pixel circuit portion PC2 may be increased. That is, the area occupied by the second pixel circuit portion PC2 may be widened. For example, the area of the second pixel circuit portion PC2 may be about twice the area of the first pixel circuit portion PC1. In this case, the area of the second emitting diode ED2 may be about twice the area of the first emitting diode ED1. However, this is only an example, and the area of the second pixel circuit portion PC2 and the second emitting diode ED2 may be set in various ways.

Although one transistor of each pixel has been described above, each pixel may include a plurality of transistors. Hereinafter, an example of a pixel of a display device according to an embodiment will be described.

Figure 6:
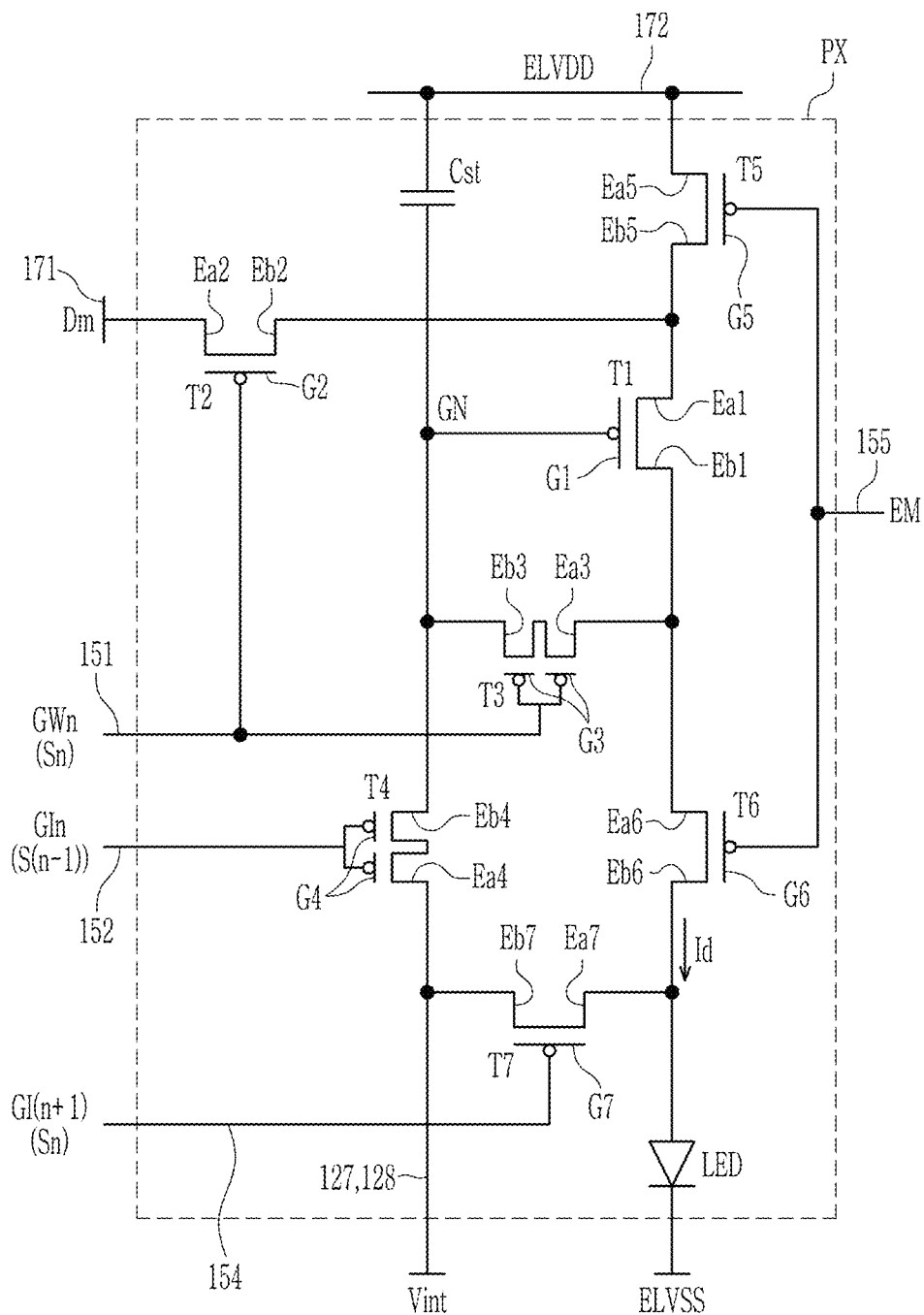
FIG. 6 is a circuit diagram of a pixel of a display device according to an embodiment.

FIG. 6 is a circuit diagram of a pixel of a display device according to an embodiment.

As shown in FIG. 6, a display device according to an embodiment includes a plurality of pixels PX that can display an image, and a plurality of signal lines 127, 151, 152, 153, 154, 171, and 172 connected to the plurality of pixels PX. Each pixel may include a plurality of transistors T1, T2, T3, T4, T5, T6, and T7 connected to the plurality of signal lines 127, 151, 152, 153, 154, 171, and 172, a capacitor Cst, and at least one light emitting diode LED. In the present embodiment, it will be exemplarily described that one pixel PX includes one light emitting diode LED.

The signal lines 127, 151, 152, 154, 155, 171, and 172 may include an initialization voltage line 127, a plurality of scan lines 151, 152, and 154, a light emission control line 155, a data line 171, and a driving voltage line 172.

The initialization voltage line 127 may transmit an initialization voltage Vint. Each of the plurality of scan lines 151, 152, and 154 may transmit scan signals GWn, GIn, and GI(n+1). The scan signals GWn, GIn, and GI(n+1) may transmit a gate-on voltage and a gate-off voltage that can turn-on/turn-off the transistors T2, T3, T4, and T4 included in the pixel PX.

The scan lines 151, 152, and 154 connected to one pixel PX may include a first scan line 151 that may transmit a scan signal GWn, a second scan line 152 that can transmit a scan signal GIn having a gate-on voltage at different timing to that of the first scan line 151, and the third scan line 154 that may transmit a scan signal GI(n+1). In the present embodiment, an example in which the second scan line 152 transmits the gate-on voltage at a timing earlier than the first scan line 151 will be mainly described. For example, when the scan signal GWn is an n-th scan signal Sn (n is a natural number greater than 1) among scan signals applied during one frame, the scan signal Gin may be a previous scan signal such as a scan signal S(n-1) and the scan signal GI(n+1) may be the n-th scan signal Sn. However, the present embodiment is not limited thereto, and the scan signal GI(n+1) may be a scan signal that is different from the n-th scan signal Sn.

The light emission control line 155 may transmit a control signal, particularly, a light emission control signal EM that is capable of controlling light emission of the light emitting diode LED included in the pixel PX. The control signal transmitted by the light emission control line 155 may transmit a gate-on voltage and a gate-off voltage, and may have a waveform that is different from the scan signal transmitted by the scan lines 151, 152, and 154.

The data line 171 may transmit a data signal Dm, and the driving voltage line 172 may transmit a driving voltage ELVDD The data signal Dm may have a different voltage level according to an image signal input to the display device, and the driving voltage ELVDD may substantially have a constant level.

The display device may further include a driver that transmits signals to the plurality of signal lines 127, 151, 152, 153, 154, 171, and 172.

The plurality of transistors T1, T2, T3, T4, T5, T6, and T7 included in one pixel PX may include a first transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3, the second scan line 152 may transmit the scan signal Gin to the fourth transistor T4, the third scan line 154 may transmit the scan signal GI(n+1) to the seventh transistor T7, and the light emission control line 155 may transmit the light emission control signal EM to the fifth transistor T5 and the sixth transistor T6.

A gate electrode G1 of the first transistor T1 is connected with one end of the capacitor Cst through a driving gate node GN, a first electrode Ea1 of the first transistor T1 is connected with the driving voltage line 172 via the fifth transistor T5, and a second electrode Eb1 of the first transistor T1 is connected with an anode of the light emitting diode LED via the sixth transistor T6. The first transistor T1 may receive the data signal Dm transmitted from the data line 171 according to the switching operation of the second transistor T2 and supply a driving current Id to the light emitting diode LED.

A gate electrode G2 of the second transistor T2 is connected with the first scan line 151, a first electrode Ea2 of the second transistor T2 is connected with the data line 171, and a second electrode Eb2 of the second transistor T2 is connected with the first electrode Ea1 of the first transistor T1 and is connected with the driving voltage line 172 via the fifth transistor T5. The second transistor T2 is turned on according to the scan signal GWn transmitted through the first scan line 151 and transmits the data signal Dm transmitted from the data line 171 to the first electrode Ea1 of the first transistor T1.

A gate electrode G3 of the third transistor T3 is connected with the first scan line 151, and a first electrode Ea3 of the third transistor T3 is connected with the second electrode Eb1 of the first transistor T1 and connected with an anode of the light emitting diode LED via the sixth transistor T6. A second electrode Eb3 of the third transistor T3 is connected to a second electrode Eb4 of the fourth transistor T4, a first end of the capacitor Cst, and the gate electrode G1 of the first transistor T1. The third transistor T3 is turned on according to the scan signal GWn transmitted through the first scan line 151, and may diode-connect the first transistor T1 by connecting the gate electrode G1 and the second electrode Eb1 of the first transistor T1.

A gate electrode G4 of the fourth transistor T4 is connected with the second scan line 152, a first electrode Ea4 of the fourth transistor T4 is connected with the initialization voltage Vint terminal of the initialization voltage Vint terminal, and a second electrode Eb4 of the fourth transistor T4 is connected with the first end of the capacitor Cst and the gate electrode G1 of the first transistor T1 through the second electrode Eb3 of the third transistor T3. The fourth transistor T4 is turned on according to the scan signal Gin transmitted through the second scan line 152 and transmits the initialization voltage Vint to the gate electrode G1 of the first transistor T1 such that a voltage of the gate electrode G1 of the first transistor T1 can be initialized.

A gate electrode G5 of the fifth transistor T5 is connected with the light emission control line 155, a first electrode Ea5 of the fifth transistor T5 is connected with the driving voltage line 172, and a second electrode Eb5 of the fifth transistor T5 is connected with the first electrode Ea1 of the first transistor T1 and the second electrode Eb2 of the second transistor T2.

A gate electrode G6 of the sixth transistor T6 is connected with the light emission control line 155, a first electrode Ea6 of the sixth transistor T6 is connected with the second electrode Eb1 of the first transistor T1 and the first electrode Ea3 of the third transistor T3, and a second electrode Eb6 of the sixth transistor T6 is electrically connected with the anode of the light emitting diode LED. The fifth transistor T5 and the sixth transistor T6 are simultaneously turned on according to the light emission control signal transmitted through the light emission control line 155 and thus the driving voltage ELVDD is compensated through the diode-connected first transistor T1 and then transmitted to the light emitting diode LED.

A gate electrode G7 of the seventh transistor T7 is connected with the third scan line 154, a first electrode Ea7 of the seventh transistor T7 is connected with the second electrode Eb6 of the sixth transistor T6 and the anode of the light emitting diode LED, and a second electrode Eb7 of the seventh transistor T7 is connected with the terminal of the initialization voltage Vint and the first electrode Ea4 of the fourth transistor T4.

The transistors T1, T2, T3, T4, T5, T6, and T7 may be P-type channel transistors such as PMOS, but are not limited thereto, and among the transistors T1, T2, T3, T4, T5, T6, and T7, at least one may be an N-type channel transistor.

The first end of the capacitor Cst is connected to the gate electrode G1 of the first transistor T1 and a second end is connected to the driving voltage line 172 as described above. A cathode of the light emitting diode LED may be connected to a terminal of a common voltage ELVSS, which transmits the common voltage ELVSS, and thus may receive the common voltage ELVSS.

Pixels PX disposed in the first display area DA1 and pixels PX disposed in the second display area DA2 both may have the circuit structure of the pixel shown in FIG. 6. However, the present invention is not limited thereto, and the circuit structure of the pixel PX disposed in the first display area DA1 may be different from the circuit structure of the pixel PX disposed in the second display area DA2. The circuit diagram of the pixel shown in FIG. 6 is only an example, and the number of transistors, the number of capacitors, and their connection relationship included in one pixel PX of the display device according to the embodiment can be variously changed.

Next, a display device according to an embodiment will be described with reference to FIG. 7.

Figure 7:
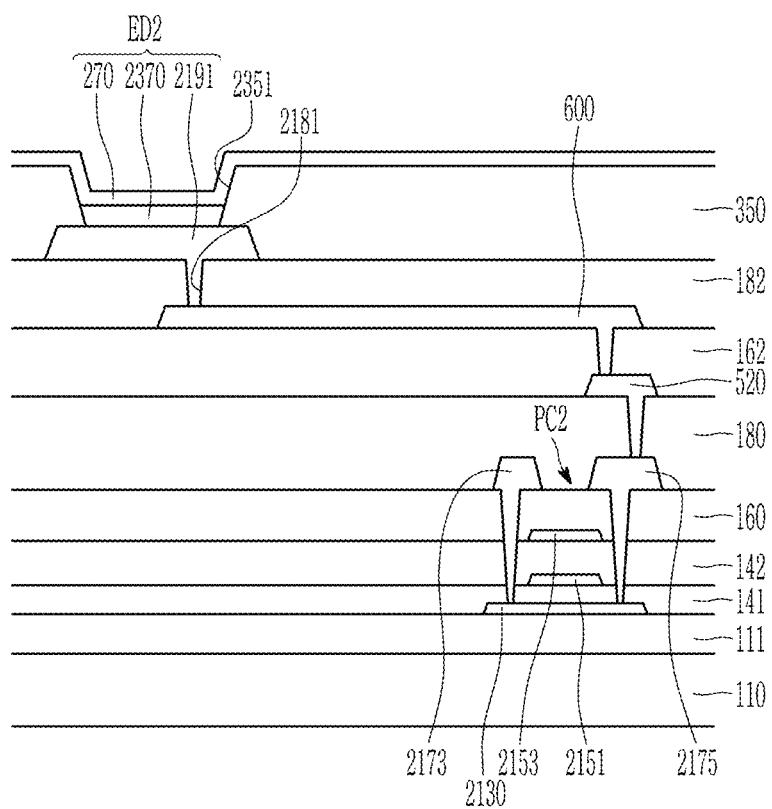
FIG. 7 is a cross-sectional view of a display device according to an embodiment.

A display device according to an embodiment shown in FIG. 7 is almost the same as the display device according to the embodiment shown in FIG. 1 to FIG. 6, and therefore the same parts will not be described. The present embodiment is different from the previous embodiment in that a bridge electrode is not formed, and will be described further below.

FIG. 7 is a cross-sectional view of a display device according to an embodiment. FIG. 7 illustrates a second pixel circuit portion PC2 and a second emitting diode ED2 disposed in a second display area DA2. Although it is not illustrated, the second emitting diode ED2 may overlap a driving circuit portion, and a shield electrode may be disposed between the second emitting diode ED2 and the driving circuit portion.

As shown in FIG. 7, a display device according to an embodiment includes a substrate 110, the second pixel circuit portion PC2 disposed on the substrate 110, and the second emitting diode ED2 connected to the second pixel circuit portion PC2.

The second pixel circuit portion PC2 includes a semiconductor 2130, a gate electrode 2151, a source electrode 2173, and a drain electrode 2175 which are disposed on the substrate 110. The second pixel circuit portion PC2 may further include a connection electrode 520, and the connection electrode 520 may be connected with the drain electrode 2175.

A second interlayer insulating layer 162 may be disposed on the connection electrode 520, and an extension wire 600 may be disposed on the second interlayer insulating layer 162. In the previous embodiment, the second interlayer insulating layer 162 may be disposed only below the extension wire 600, and in the present embodiment, the second interlayer insulating layer 162 may be disposed not only under the extension wire 600 but also entirely. That is, the second interlayer insulating layer 162 may be entirely disposed on the first display area DA1 and the second display area DA2 of the substrate 110. In the previous embodiment, the second interlayer insulating layer 162 and the extension wire 600 may be patterned simultaneously with the same mask, and in the present embodiment, the second interlayer insulating layer 162 and the extension wire 600 may be patterned separately by using different masks, respectively.

The second interlayer insulating layer 162 may include an opening that overlaps the connection electrode 520, and the extension wire 600 may be connected with the connection electrode 520 through the opening. In the previous embodiment, the extension wire 600 and the connection electrode 520 are not directly connected, but may be connected through a bridge electrode. In the present embodiment, the bridge electrode is not formed, and the extension wire 600 and the connection electrode 520 can be directly connected.

A second protective layer 182 may be disposed on the second interlayer insulating layer 162 and the extension wire 600, and the second emitting diode ED2 connected with the second pixel circuit portion PC2 may be disposed on the second protective layer 182. The second emitting diode ED2 may include a pixel electrode 2191, an emission layer 2370, and a common electrode 270. The pixel electrode 2191 of the second emitting diode ED2 may be connected with the second pixel circuit portion PC2 through the pixel electrode 2191.

In the display device according to the present embodiment, the second pixel circuit portion PC2 and the second emitting diode ED2 are connected through the extension wire 600 disposed on a different layer from the pixel electrode 2191 of the second emitting diode ED2, thereby simplifying the wire and preventing a short circuit failure.

Next, referring to FIG. 8, a display device according to an embodiment will be described.

Figure 8:
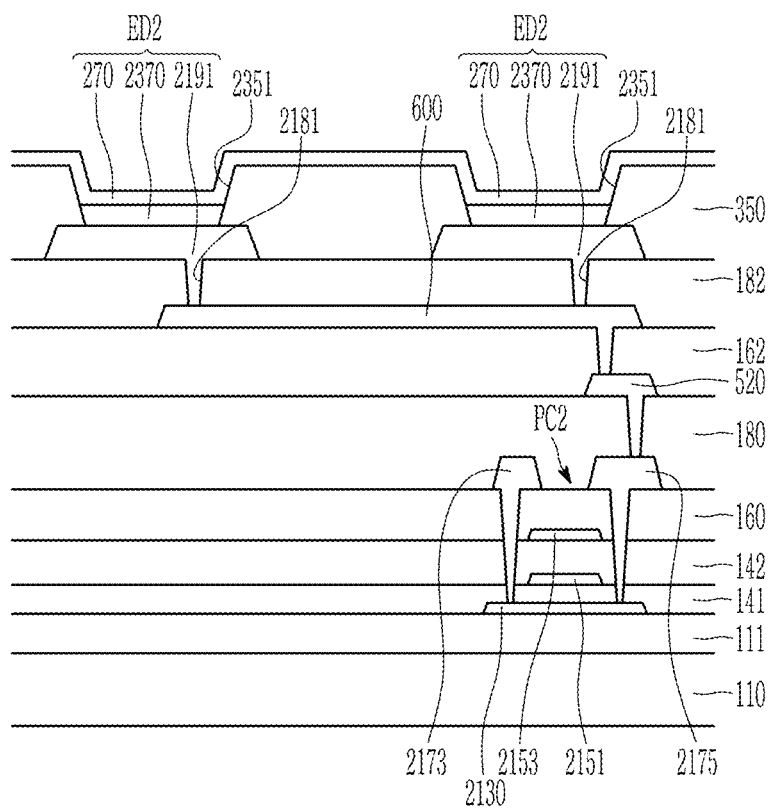
FIG. 8 is a cross-sectional view of a display device according to an embodiment.

A display device according to an embodiment shown in FIG. 8 is almost the same as the display device according to the embodiment shown in FIG. 7, and therefore, the same parts will not be described. The present embodiment is different from the previous embodiment in that a plurality of second emitting diodes ED2 are connected to one second pixel circuit portion PC2, and this will be described in detail.

FIG. 8 is a cross-sectional view of a display device according to an embodiment. FIG. 8 illustrate a second pixel circuit portion PC2 and a second emitting diode ED2 that are disposed in a second display area DA2. Although it is not illustrated, the second emitting diode ED2 may overlap a driving circuit portion, and a shield electrode may be disposed between the second emitting diode ED2 and the driving circuit portion.

As shown in FIG. 8, a display device according to an embodiment includes a substrate 110, the second pixel circuit portion PC2 disposed on the substrate 110, and the second emitting diode ED2 connected to the second pixel circuit portion PC2.

In the previous embodiment, one second pixel circuit portion PC2 may be connected to one second emitting diode ED2. In the present embodiment, one second pixel circuit portion PC2 may be connected to a plurality of second emitting diodes ED2.

For example, each second pixel circuit portion PC2 of the display device according to the present embodiment may be connected with two second emitting diodes ED2. A drain electrode 2175 of the second pixel circuit portion PC2 is connected with a connection electrode 520, and the connection electrode 520 may be connected with an extension wire 600. The extension wire 600 may be two pixel electrodes 2191 that are separated from each other. A second protective layer 182 may be disposed on the extension wire 600, and the second protective layer 182 may include a plurality of openings 2181 that partially overlap the extension wire 600. A plurality of pixel electrodes 2191 may be separately disposed on the second protective layer 182. Two separated pixel electrodes 2191 may be connected with the same extension wire 600 through the opening 2181. An emission layer 2370 and a common electrode 270 are respectively disposed on the two pixel electrodes 2191 such that two second light emitting diodes ED2 are formed. Thus, one second pixel circuit portion PC2 may be connected to two light emitting diodes ED2 through the extension wire 600.

However, the number of second light emitting diodes ED2 connected to one second pixel circuit portion PC2 is not limited thereto, and each second pixel circuit portion PC2 may be connected to three or more second light emitting diodes ED2.

In addition, the extension wire 600 is connected to two separated pixel electrodes 2191 in the present embodiment, but the present embodiment is not limited thereto. The extension wire 600 may be connected to a single pixel electrode 2191, and the pixel electrode 2191 connected to the extension wire 600 is extended to two or more points to form two or more second emitting diodes ED2.

The plurality of pixel electrodes 2191 connected to the second pixel circuit portion PC2 may be applied with the same signal. Thus, the plurality of second light emitting diodes ED2 connected to the second pixel circuit portion PC2 may emit with the same luminance. In the display device according to the present embodiment, a single second pixel circuit portion PC2 is connected to a plurality of second light emitting diodes ED2 such that the number of second light emitting diodes ED2 can be increased. Accordingly, it is possible to prevent a boundary between a first display area DA1 and a second display area DA2 from being visually recognized according to a difference in resolution between the first display area DA1 and the second display area DA2.

Next, a display device according to an embodiment will be described with reference to FIG. 9.

Figure 9:
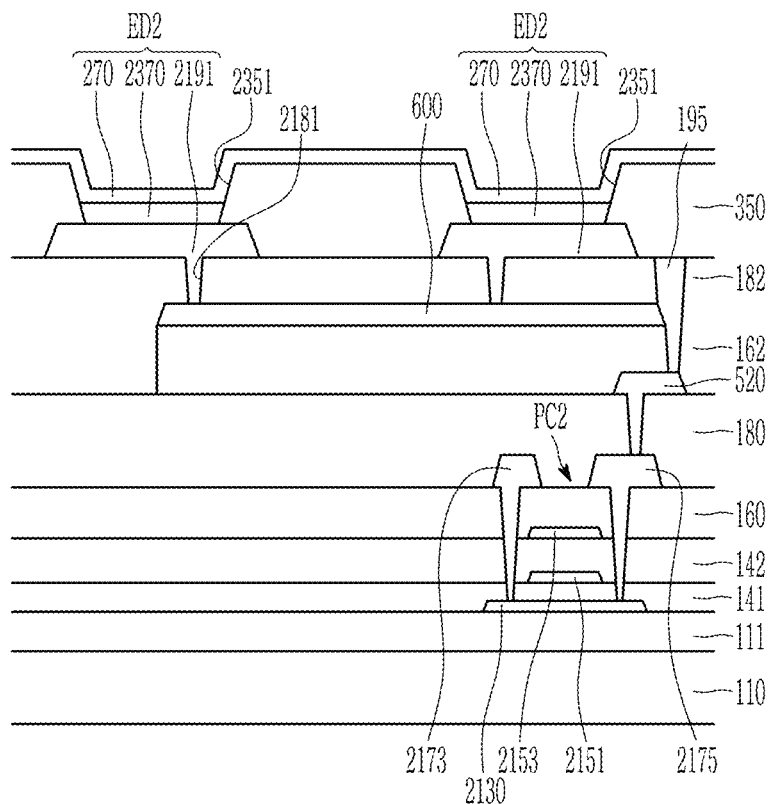
FIG. 9 is a cross-sectional view of a display device according to an embodiment.

A display device according to an embodiment shown in FIG. 9 is almost the same as the display device according to the embodiment shown in FIG. 1 to FIG. 6, and therefore the same parts will not be described. The present embodiment is different from the previous embodiment in that a plurality of second emitting diodes ED2 are connected to one second pixel circuit portion PC2, and this will be described in detail.

FIG. 9 is a cross-sectional view of a display device according to an embodiment. FIG. 9 illustrates a second pixel circuit portion PC2 and a second emitting diode ED2 disposed in a second display area DA2. Although it is not illustrated, the second emitting diode ED2 may overlap a driving circuit portion, and a shield electrode may be disposed between the second emitting diode ED2 and the driving circuit portion.

As shown in FIG. 9, a display device according to an embodiment includes a substrate 110, the second pixel circuit portion PC2 disposed on the substrate 110, and the second emitting diode ED2 connected to the second pixel circuit portion PC2.

In the previous embodiment, one second pixel circuit portion PC2 may be connected to one second emitting diode ED2. In the present embodiment, one second pixel circuit portion PC2 may be connected with a plurality of second emitting diodes ED2.

For example, each second pixel circuit portion PC2 of the display device according to the present embodiment may be connected with two second emitting diodes ED2. A drain electrode 2175 of the second pixel circuit portion PC2 is connected with a connection electrode 520, and the connection electrode 520 may be connected with an extension wire 600 through a bridge electrode 195. The extension wire 600 may be two pixel electrodes 2191 that are separated from each other. An emission layer 2370 and a common electrode 270 are respectively disposed on the two pixel electrodes 2191 such that two second light emitting diodes ED2 are formed. Thus, one second pixel circuit portion PC2 may be connected to two light emitting diodes ED2 through the extension wire 600. However, this is not restrictive, and one second pixel circuit portion PC2 may be connected to three or more second emitting diodes ED2. In addition, the extension wire 600 may be connected to a single pixel electrode 2191, and the pixel electrodes 2191 connected to the extension wire 600 may extend to two or more points such that two or more second emitting diodes ED2 can be formed.

In the display device according to the present embodiment, one second pixel circuit portion PC2 is connected to a plurality of second emitting diodes ED2 such that the number of second emitting diodes ED2 can be increased. Thus, it is possible to prevent a boundary between a first display area DA1 and a second display area DA2 from being viewed according to a difference in resolution between the first display area DA1 and the second display area DA2.

In the display device according to the embodiment shown in FIG. 8 and FIG. 9, one second pixel circuit portion PC2 is connected to a plurality of second emitting diodes ED2. In this case, the plurality of second emitting diodes ED2 can be variously arranged, and various alignments of the second emitting diodes ED2 will be described hereinafter with reference to FIG. 10 to FIG. 21.

First, referring to FIG. 10 and FIG. 11, a connection relationship and alignment form of a plurality of second emitting diode ED2 of a display device according to an embodiment will be described.

Figure 10:
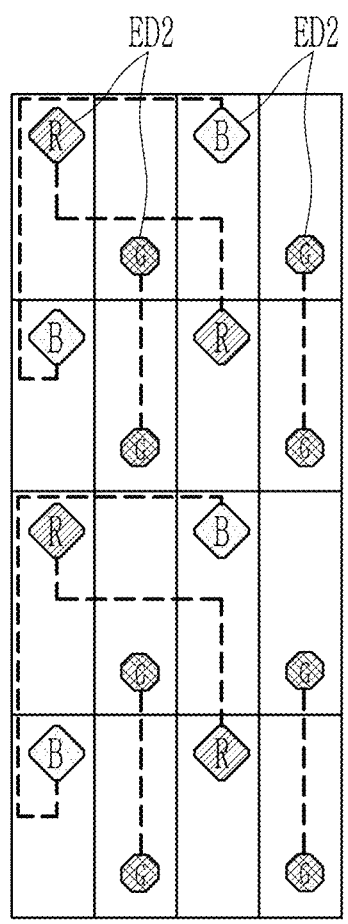
FIG. 10 is a top plan view of a connection relationship of a plurality of second light emitting diodes of a display device according to an embodiment.
Figure 11:
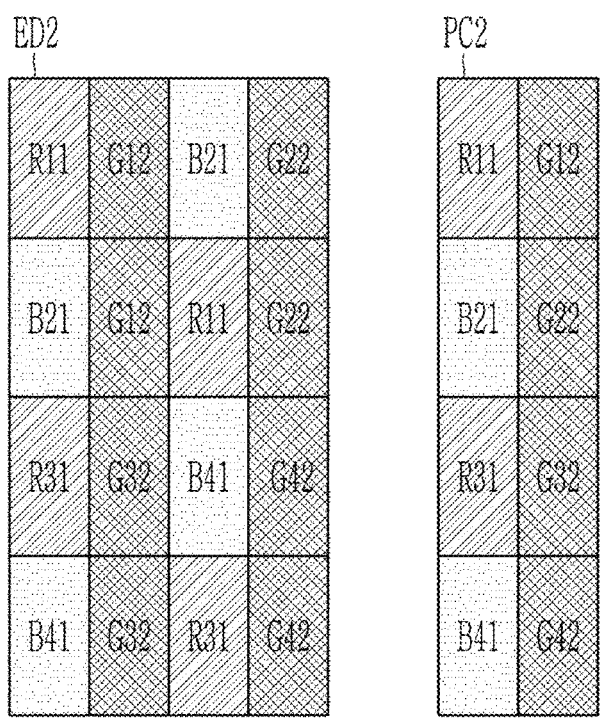
FIG. 11 shows an alignment form of second pixel circuit portions and an alignment form of second emitting diodes of the display device according to the embodiment.

FIG. 10 is a top plan view of a connection relationship of a plurality of second light emitting diodes of a display device according to an embodiment, and FIG. 11 shows an alignment form of second pixel circuit portions and an alignment form of second emitting diodes of the display device according to the embodiment. In FIG. 11, the second pixel circuit portion PC2 and the second emitting diode ED2 are separately illustrated for description, but actually, the second pixel circuit portion PC2 may overlap a part of the second emitting diode ED2.

As shown in FIG. 10 and FIG. 11, a plurality of second emitting diodes ED2 may be arranged in a row direction and a column direction on a second display area of a substrate of a display device according to an embodiment. For example, a second emitting diode ED2 displaying red R, a second emitting diode ED2 displaying green G, a second emitting diode ED2 displaying blue B, and a second emitting diode ED2 displaying green G may be sequentially arranged in a first row and a third row. A second emitting diode ED2 displaying blue B, a second emitting diode ED2 displaying green G, a second emitting diode ED2 displaying R, and a second emitting diode ED2 displaying green G may be sequentially arranged in a second row and a fourth row.

The second emitting diode ED2 displaying red R, disposed in the first row and the first column and the second emitting diode ED2 displaying red R, disposed in the second row and the third column may be connected with each other. The second emitting diode ED2 displaying green G, disposed in the first row and the second column and the second emitting diode ED2 displaying green G, disposed in the second row and the second column may be connected with each other. The second emitting diode ED2 displaying blue B disposed in the first row and third column and the second emitting diode ED2 displaying blue B disposed in the second row and first column may be connected to each other. The second emitting diode ED2 displaying green G disposed in the first row and fourth column and the second emitting diode ED2 displaying green G disposed in the second row and fourth column may be connected to each other. Similarly, a plurality of second emitting diodes ED2 displaying the same color among the second emitting diodes ED2 disposed in the third and fourth rows may be connected to each other.

The plurality of second emitting diodes ED2 may be connected to each other by an extension wire or may be connected to each other by a pixel electrode.

A plurality of second pixel circuit portions PC2 may be arranged in a row direction and a column direction on the second display area of the substrate of the display device according to the embodiment. Each of the second pixel circuit portions PC2 may be connected with a plurality of second emitting diodes ED2. One second pixel circuit portion PC2 may be connected with two second emitting diodes ED2. For example, a second pixel circuit portion PC2 disposed in the first row and the first column is connected with the second emitting diode ED2 disposed in the first row and the first column and the second emitting diode ED2 disposed in the second row and the third column and thus may transmit the same signal R11. Thus, the second emitting diode ED2 disposed in the first row and the first column and the second emitting diode ED2 disposed in the second row and the second column may have the same luminance. In addition, the second pixel circuit portion PC2 disposed in the first row and the second column is connected with the second emitting diode ED2 disposed in the first row and the second column and the second emitting diode ED2 disposed in the second row and the second column and thus may transmit the same signal G12. In addition, the second pixel circuit portion PC2 disposed in the second row and the first column is connected with the second emitting diode ED2 disposed in the first row and the third column and the second emitting diode ED2 disposed in the second row and the first column and thus may transmit the same signal B21. In addition, the second pixel circuit portion PC2 disposed in the second row and the second column is connected with the second emitting diode ED2 disposed in the first row and the fourth column and the second emitting diode ED2 disposed in the second row and the fourth column and thus may transmit the same signal G22. Similarly, each second pixel circuit portion PC2 disposed in the third and fourth rows may be connected to a plurality of second emitting diodes ED2 to transmit the same signal.

For the signal transmitted to the second emitting diode ED2, a value calculated through rendering may be used. The size or disposition interval of the second emitting diodes ED2 may be similar to those of the first emitting diode. Accordingly, it is possible to prevent the boundary between the first display area DA1 and the second display area DA2 from being viewed.

Next, referring to FIG. 12 and FIG. 13, a connection relationship and alignment form of a plurality of second emitting diode ED2 of a display device according to an embodiment will be described.

Figure 12:
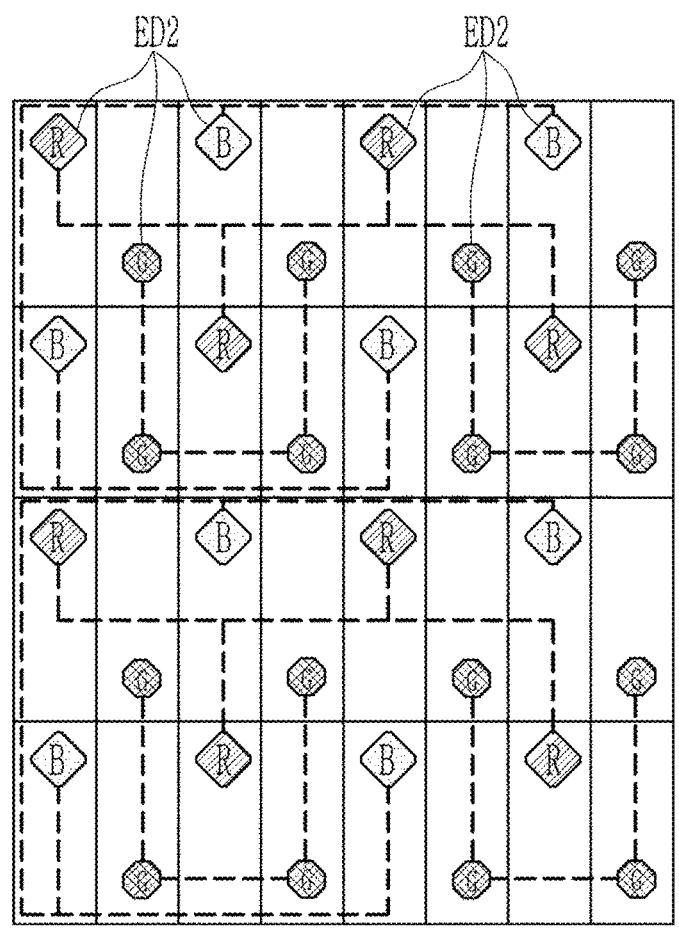
FIG. 12 is a top plan view of a connection relationship of a plurality of second light emitting diodes of a display device according to an embodiment.
Figure 13:
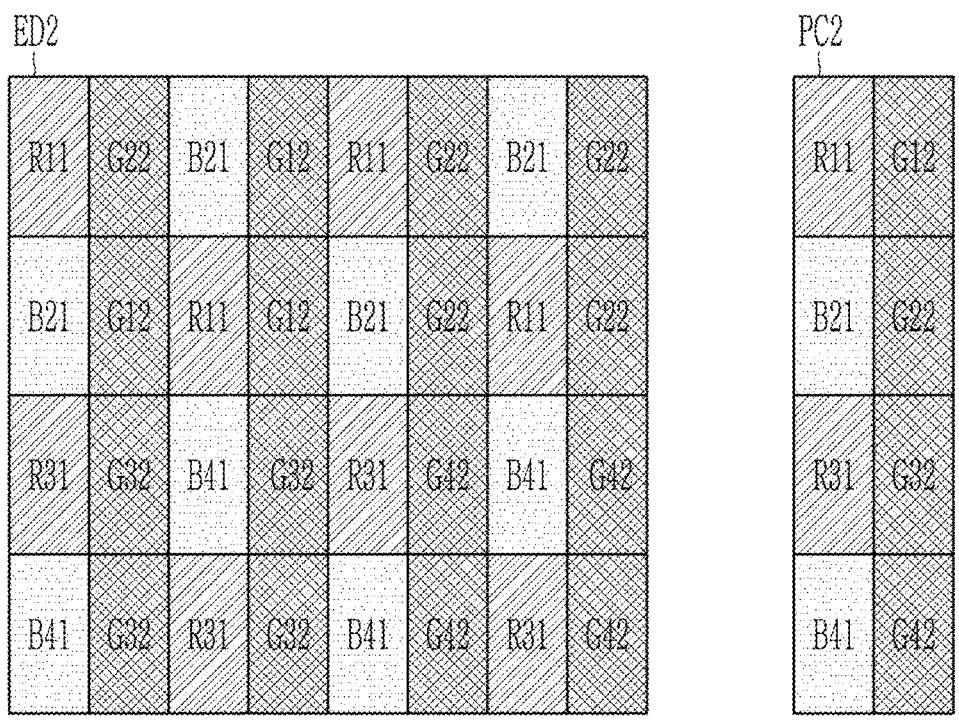
FIG. 13 shows an alignment form of second pixel circuit portions and an alignment form of second emitting diodes of the display device according to the embodiment.

FIG. 12 is a top plan view of a connection relationship of a plurality of second light emitting diodes of a display device according to an embodiment, and FIG. 13 shows an alignment form of second pixel circuit portions and an alignment form of second emitting diodes of the display device according to the embodiment. In FIG. 13, the second pixel circuit portion PC2 and the second emitting diode ED2 are separately illustrated for description, but actually, the second pixel circuit portion PC2 may overlap a part of the second emitting diode ED2.

As shown in FIG. 12 and FIG. 13, a plurality of second emitting diodes ED2 may be arranged in a row direction and a column direction on a second display area of a substrate of a display device according to an embodiment. For example, a second emitting diode ED2 displaying red R, a second emitting diode ED2 displaying green G, a second emitting diode ED2 displaying blue B, and a second emitting diode ED2 displaying green G may be sequentially arranged in a first row and a third row. A second emitting diode ED2 displaying blue B, a second emitting diode ED2 displaying green G, a second emitting diode ED2 displaying R, and a second emitting diode ED2 displaying green G may be sequentially arranged in a second row and a fourth row.

The four second emitting diodes ED2 displaying R, disposed in the first row and the first column, the first row and a fifth column, the second row and the third column, and the second row and a seventh column may be connected with each other. The fourth second emitting diodes ED2 disposed in the first row and second column, the first row and fourth column, and second row and second column, and the second row and fourth column and displaying green G may be connected with each other. The fourth second emitting diodes ED2 displaying blue B and disposed in the first row and third column, the first row and seventh column, the second row and first column, and the second row and fifth column may be connected with each other. The four second emitting diodes ED2 displaying green G and disposed in the first row and sixth column, the first row and eighth column, the second row and sixth column, and the second row and eighth column may be connected with each other. Similarly, a plurality of second emitting diodes ED2 displaying the same color among the second emitting diodes ED2 disposed in the third and fourth rows may be connected to each other.

The plurality of second emitting diodes ED2 may be connected to each other by an extension wire or may be connected to each other by a pixel electrode.

A plurality of second pixel circuit portions PC2 may be arranged in a row direction and a column direction on the second display area of the substrate of the display device according to the embodiment. Each of the second pixel circuit portions PC2 may be connected with a plurality of second emitting diodes ED2. One second pixel circuit portion PC2 may be connected with four second emitting diodes ED2. For example, the second pixel circuit portion PC2 disposed in the first row and first column may be connected with the second emitting diodes ED2 disposed in the first row and first column, the first row and fifth column, the second row and third column, and the second row and seventh column and thus may transmit the same signal R11. In addition, the second pixel circuit portion PC2 disposed in the first row and second column may be connected with the second emitting diodes ED2 disposed in the first row and second column, the first row and fourth column, the second row and second column, and the second row and fourth column and thus may transmit the same signal G12. In addition, the second pixel circuit portion PC2 disposed in the second row and firth column may be connected with the second emitting diodes ED2 disposed in the first row and third column, the first row and seventh column, the second row and first column, and the second row and fifth column and thus may transmit the same signal B21. In addition, the second pixel circuit portion PC2 disposed in the second row and second column may be connected with the second emitting diodes ED2 disposed in the first row and sixth column, the first row and eighth column, the second row and sixth column, and the second row and eighth column and thus may transmit the same signal G22. Similarly, each second pixel circuit portion PC2 disposed in the third and fourth rows may be connected to a plurality of second emitting diodes ED2 to transmit the same signal.

For the signal transmitted to the second emitting diode ED2, a value calculated through rendering may be used. The size or disposition interval of the second emitting diodes ED2 may be similar to those of the first emitting diode. Accordingly, it is possible to prevent the boundary between the first display area DA1 and the second display area DA2 from being viewed.

Next, referring to FIG. 14 and FIG. 15, a connection relationship and alignment form of a plurality of second emitting diodes ED2 of a display device according to an embodiment will be described.

Figure 14:
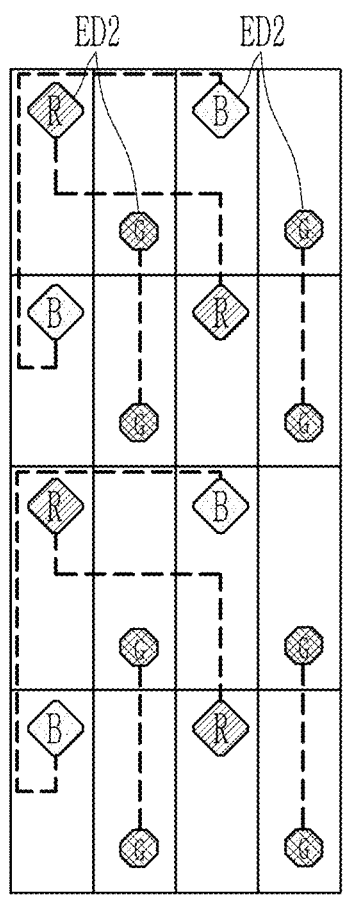
FIG. 14 is a top plan view of a connection relationship of a plurality of second light emitting diodes of a display device according to an embodiment.
Figure 15:
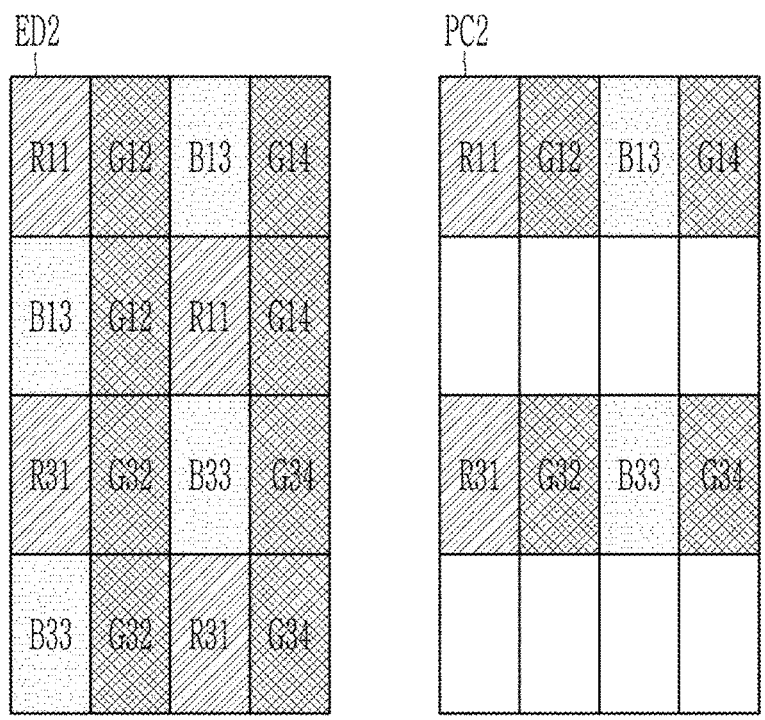
FIG. 15 shows an alignment form of second pixel circuit portions and an alignment form of second emitting diodes of the display device according to the embodiment.

FIG. 14 is a top plan view of a connection relationship of a plurality of second light emitting diodes of a display device according to an embodiment, and FIG. 15 shows an alignment form of second pixel circuit portions and an alignment form of second emitting diodes of the display device according to the embodiment. In FIG. 15, the second pixel circuit portion PC2 and the second emitting diode ED2 are separately illustrated for description, but actually, the second pixel circuit portion PC2 may overlap a part of the second emitting diode ED2.

As shown in FIG. 14 and FIG. 15, a plurality of second emitting diodes ED2 may be arranged in a row direction and a column direction on a second display area of a substrate of a display device according to an embodiment. For example, a second emitting diode ED2 displaying red R, a second emitting diode ED2 displaying green G, a second emitting diode ED2 displaying blue B, and a second emitting diode ED2 displaying green G may be sequentially arranged in a first row and a third row. A second emitting diode ED2 displaying blue B, a second emitting diode ED2 displaying green G, a second emitting diode ED2 displaying R, and a second emitting diode ED2 displaying green G may be sequentially arranged in a second row and a fourth row.

Two second emitting diodes ED2 disposed in a first row and first column and a first row and third column and displaying red R may be connected with each other. Two second emitting diodes ED2 disposed in the first row and second column and the second row and second column and displaying red R may be connected with each other. Two second emitting diodes ED2 disposed in the first row and third column and the second row and first column may be connected with each other. Two second emitting diodes ED2 disposed in the first row and fourth column and the second row and fourth column and displaying green G may be connected with each other. Similarly, a plurality of second emitting diodes ED2 displaying the same color among the second emitting diodes ED2 disposed in the third and fourth rows may be connected to each other.

The plurality of second emitting diodes ED2 may be connected to each other by an extension wire or may be connected to each other by a pixel electrode.

A plurality of second pixel circuit portions PC2 may be arranged in a row direction and a column direction on the second display area of the substrate of the display device according to the embodiment. Each of the second pixel circuit portions PC2 may be connected with a plurality of second emitting diodes ED2. One second pixel circuit portion PC2 may be connected with two second emitting diodes ED2. The second pixel circuit portion PC2 disposed in the first row and first column is connected with the second emitting diodes ED2 disposed in the first row and first column and the second row and third column and thus may transmit the same signal R11. In addition, the second pixel circuit portion PC2 disposed in the first row and second column may be connected with the second emitting diodes ED2 disposed in the first row and second column and the second row and second column and thus may transmit the same signal G12. In addition, the second pixel circuit portion PC2 disposed in the first row and third column may be connected with the second emitting diodes ED2 disposed in the first row and third column and the second row and first column and thus may transmit the same signal B13. In addition, the second pixel circuit portion PC2 disposed in the first row and fourth column may be connected with the second emitting diodes ED2 disposed in the first row and fourth column and the second row and fourth column and thus may transmit the same signal G14. Similarly, each second pixel circuit portion PC2 disposed in the third row may be connected to a plurality of second emitting diodes ED2 to transmit the same signal. In the present embodiment, the second pixel circuit portions PC2 are not disposed in the second row and the fourth row and accordingly, the number of scan lines can be reduced to half.

For the signal transmitted to the second emitting diode ED2, a value calculated through rendering may be used. The size or disposition interval of the second emitting diodes ED2 may be similar to those of the first emitting diode. Accordingly, it is possible to prevent the boundary between the first display area DA1 and the second display area DA2 from being viewed.

Next, referring to FIG. 16 and FIG. 17, a connection relationship and alignment form of a plurality of second emitting diodes ED2 of a display device according to an embodiment will be described.

Figure 16:
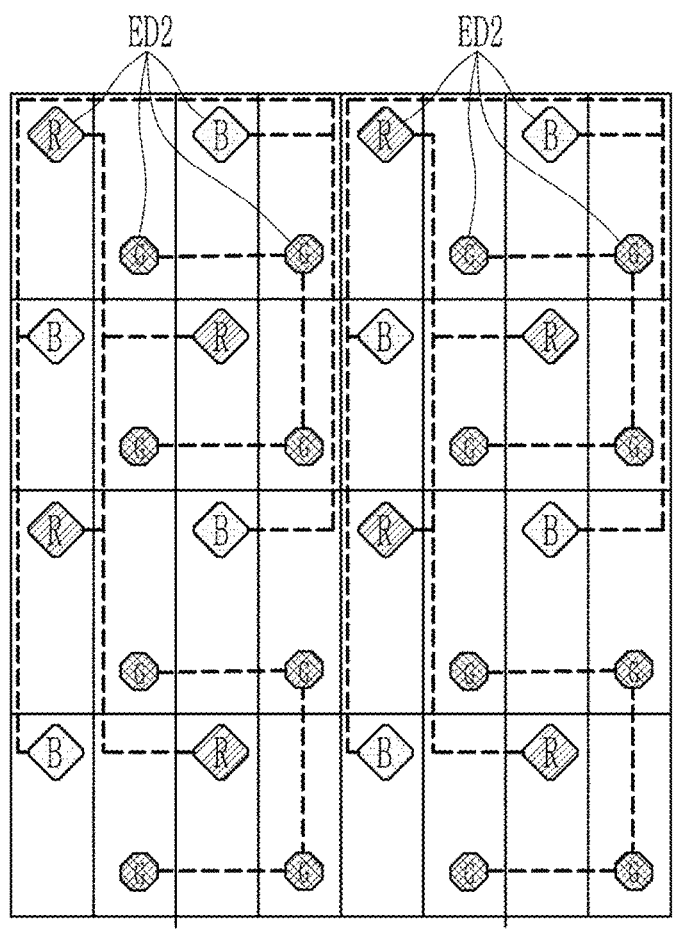
FIG. 16 is a top plan view of a connection relationship of a plurality of second light emitting diodes of a display device according to an embodiment.
Figure 17:
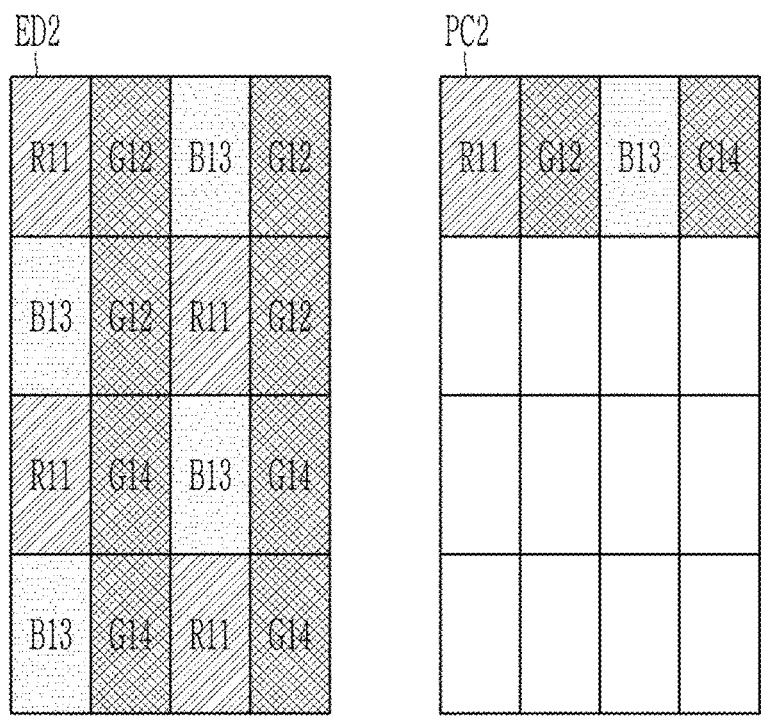
FIG. 17 shows an alignment form of second pixel circuit portions and an alignment form of second emitting diodes of the display device according to the embodiment.

FIG. 16 is a top plan view of a connection relationship of a plurality of second light emitting diodes of a display device according to an embodiment, and FIG. 17 shows an alignment form of second pixel circuit portions and an alignment form of second emitting diodes of the display device according to the embodiment. In FIG. 17, the second pixel circuit portion PC2 and the second emitting diode ED2 are separately illustrated for description, but actually, the second pixel circuit portion PC2 may overlap a part of the second emitting diode ED2.

As shown in FIG. 16 and FIG. 17, a plurality of second emitting diodes ED2 may be arranged in a row direction and a column direction on a second display area of a substrate of a display device according to an embodiment. For example, a second emitting diode ED2 displaying red R, a second emitting diode ED2 displaying green G, a second emitting diode ED2 displaying blue B, and a second emitting diode ED2 displaying green G may be sequentially arranged in a first row and a third row. A second emitting diode ED2 displaying blue B, a second emitting diode ED2 displaying green G, a second emitting diode ED2 displaying R, and a second emitting diode ED2 displaying green G may be sequentially arranged in a second row and a fourth row.

The four second emitting diodes ED2 disposed in the first row and first column, the second row and third column, the third row and first column, and the fourth row and third column and displaying red R may be connected with each other. The fourth second emitting diodes ED2 disposed in the first row and second column, the first row and fourth column, the second row and second column, and the second row and fourth column and displaying green G may be connected with each other. The four second emitting diodes ED2 disposed in the first row and third column, the second row and first column, the third row and third column, and the fourth row and first column and displaying blue B may be connected with each other. The four second emitting diodes ED2 disposed in the third row and second column, the third row and fourth column, the fourth row and second column, and the fourth row and fourth column and displaying green G may be connected with each other. Similarly, a plurality of second emitting diodes ED2 displaying the same color among the second emitting diodes ED2 disposed in fifth to eighth columns may be connected with each other. In the present embodiment, the second pixel circuit portion PC2 is not disposed in the second to fourth rows, and thus the number of scan lines can be reduced to one quarter.

The plurality of second emitting diodes ED2 may be connected to each other by an extension wire or may be connected to each other by a pixel electrode.

A plurality of second pixel circuit portions PC2 may be arranged in a row direction and a column direction on the second display area of the substrate of the display device according to the embodiment. Each of the second pixel circuit portions PC2 may be connected with a plurality of second emitting diodes ED2. One second pixel circuit portion PC2 may be connected with two second emitting diodes ED2. For example, the second pixel circuit portions PC2 disposed in the first row and first column, the second row and third column, the third row and first column, and the fourth row and third column may be connected with the second emitting diodes ED2 and thus may transmit the same signal R11. In addition, the second pixel circuit portion PC2 disposed in the first row and second column may be connected with the second emitting diodes ED2 disposed in the first row and second column, the first row and fourth column, the second row and second column, and the second row and fourth column and thus may transmit the same signal G12. In addition, the second pixel circuit portion PC2 disposed in the first row and third column may be connected with the second emitting diodes ED2 disposed in the third row and second column, the third row and fourth column, the fourth row and second column, and the fourth row and fourth column and thus may transmit the same signal B13. In addition, the second pixel circuit portion PC2 disposed in the first row and fourth column may be connected with the second emitting diodes ED2 disposed in the third row and second column, the third row and fourth column, the fourth row and second column, and the fourth row and fourth column and thus may transmit the same signal G14. Similarly, each second pixel circuit portion PC2 disposed in fifth to eighth columns may be connected to a plurality of second emitting diodes ED2 to transmit the same signal.

For the signal transmitted to the second emitting diode ED2, a value calculated through rendering may be used. The size or disposition interval of the second emitting diodes ED2 may be similar to those of the first emitting diode. Accordingly, it is possible to prevent the boundary between the first display area DA1 and the second display area DA2 from being viewed.

Next, referring to FIG. 18 and FIG. 19, a connection relationship and alignment form of a plurality of second emitting diode ED2 of a display device according to an embodiment will be described.

Figure 18:
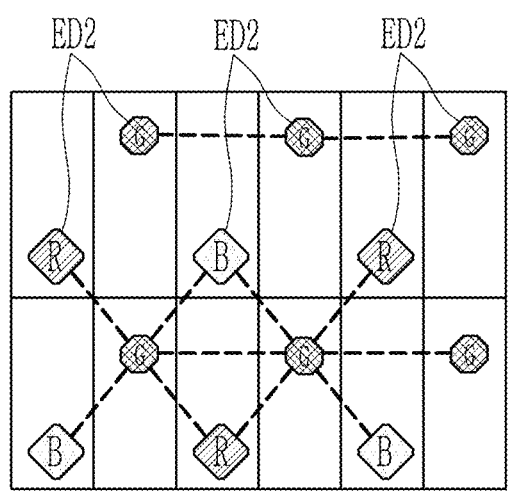
FIG. 18 is a top plan view of a connection relationship of a plurality of second light emitting diodes of a display device according to an embodiment.
Figure 19:
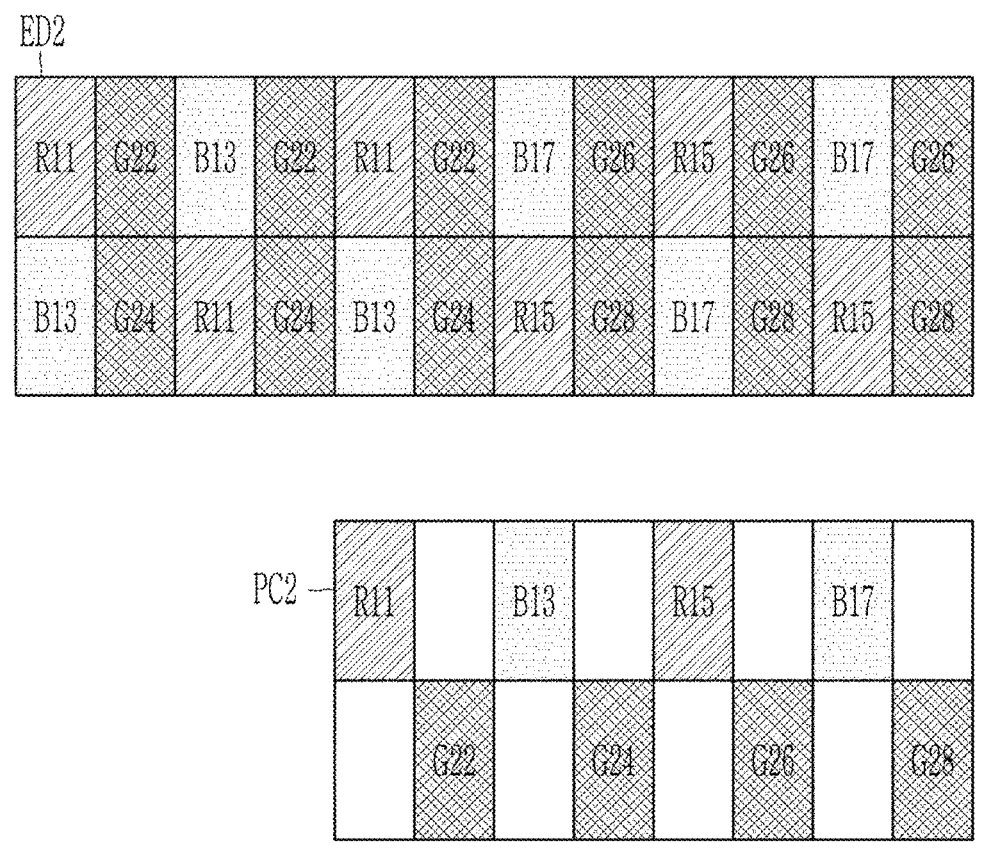

FIG. 18 is a top plan view of a connection relationship of a plurality of second light emitting diodes of a display device according to an embodiment, and FIG. 19 shows an alignment form of second pixel circuit portions and an alignment form of second emitting diodes of the display device according to the embodiment. In FIG. 19, the second pixel circuit portion PC2 and the second emitting diode ED2 are separately illustrated for description, but actually, the second pixel circuit portion PC2 may overlap a part of the second emitting diode ED2.

As shown in FIG. 18 and FIG. 19, a plurality of second emitting diodes ED2 may be arranged in a row direction and a column direction on a second display area of a substrate of a display device according to an embodiment. For example, a second emitting diode ED2 displaying red R, a second emitting diode ED2 displaying green G, a second emitting diode ED2 displaying blue B, and a second emitting diode ED2 displaying green G may be sequentially arranged in a first row and a third row. A second emitting diode ED2 displaying blue B, a second emitting diode ED2 displaying green G, a second emitting diode ED2 displaying R, and a second emitting diode ED2 displaying green G may be sequentially arranged in a second row.

The three second emitting diodes ED2 disposed in the first row and first column, the second row and third column, and the first row and fifth column and displaying red R may be connected with each other. The three second emitting diodes ED2 disposed in the first row and second column, the first row and fourth column, and the first row and sixth column and displaying green G may be connected with each other. The three second emitting diodes ED2 disposed in the second row and first column, the first row and third column, and the second row and fifth column and displaying blue B may be connected with each other. The three second emitting diodes ED2 disposed in the second row and second column, the second row and fourth column, and the second row and sixth column and displaying green G may be connected with each other. Similarly, a plurality of second emitting diodes ED2 displaying the same color among the second emitting diodes ED2 disposed in seventh to twelfth columns may be connected with each other.

The plurality of second emitting diodes ED2 may be connected to each other by an extension wire or may be connected to each other by a pixel electrode.

A plurality of second pixel circuit portions PC2 may be arranged in a row direction and a column direction on the second display area of the substrate of the display device according to the embodiment. Each of the second pixel circuit portions PC2 may be connected with a plurality of second emitting diodes ED2. One second pixel circuit portion PC2 may be connected with two second emitting diodes ED2. For example, the second pixel circuit portions PC2 disposed in the first row and first column, the second row and third column, the third row and first column, and the first row and fifth column may be connected with the second emitting diodes ED2 and thus may transmit the same signal R11. In addition, the second pixel circuit portion PC2 disposed in the first row and second column may be connected with the second emitting diodes ED2 disposed in the first row and second column, the first row and fourth column, and the first row and sixth column and thus may transmit the same signal G12. In addition, the second pixel circuit portion PC2 disposed in the first row and third column may be connected with the second emitting diodes ED2 disposed in the second row and first column, the first row and third column, and the second row and fifth column and thus may transmit the same signal B13. In addition, the second pixel circuit portion PC2 disposed in the second row and fourth column may be connected with the second emitting diodes ED2 disposed in the second row and second column, the second row and fourth column, and the second row and sixth column and thus may transmit the same signal G24. Similarly, each second pixel circuit portion PC2 disposed in fifth to eighth columns may be connected to a plurality of second emitting diodes ED2 to transmit the same signal.

For the signal transmitted to the second emitting diode ED2, a value calculated through rendering may be used. The size or disposition interval of the second emitting diodes ED2 may be similar to those of the first emitting diode. Accordingly, it is possible to prevent the boundary between the first display area DA1 and the second display area DA2 from being viewed.

Next, referring to FIG. 20 and FIG. 21, a connection relationship and alignment form of a plurality of second emitting diode ED2 of a display device according to an embodiment will be described.

Figure 20:
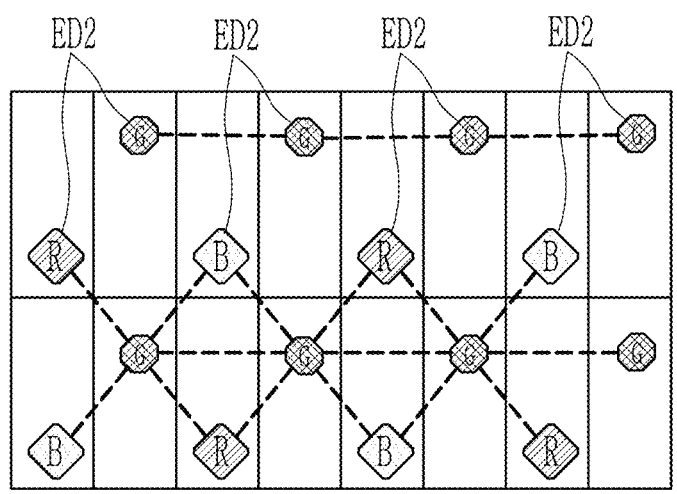
FIG. 20 is a top plan view of a connection relationship of a plurality of second light emitting diodes of a display device according to an embodiment.
Figure 21:
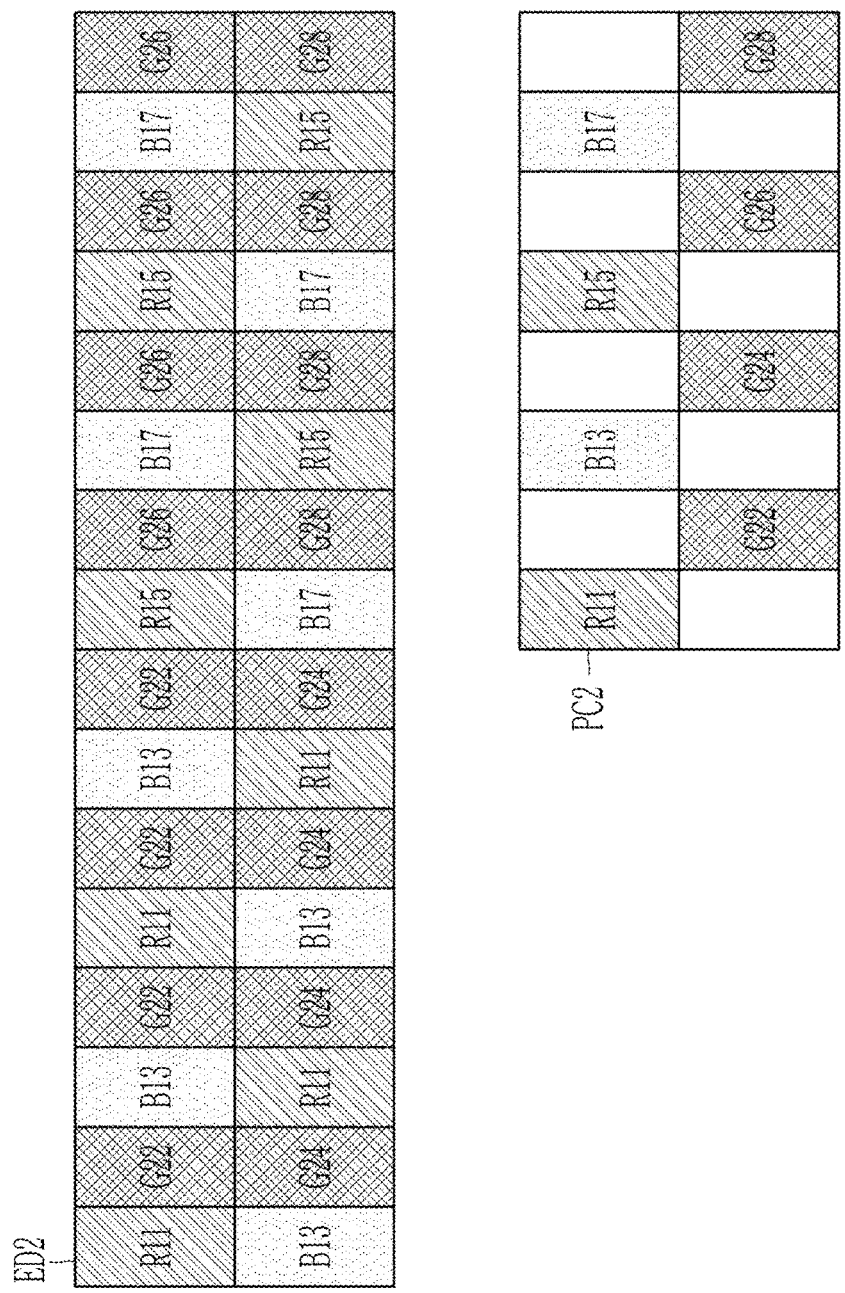
FIG. 21 shows an alignment form of second pixel circuit portions and an alignment form of second emitting diodes of the display device according to the embodiment.

FIG. 20 is a top plan view of a connection relationship of a plurality of second light emitting diodes of a display device according to an embodiment, and FIG. 21 shows an alignment form of second pixel circuit portions and an alignment form of second emitting diodes of the display device according to the embodiment. In FIG. 21, the second pixel circuit portion PC2 and the second emitting diode ED2 are separately illustrated for description, but actually, the second pixel circuit portion PC2 may overlap a part of the second emitting diode ED2.

As shown in FIG. 20 and FIG. 21, a plurality of second emitting diodes ED2 may be arranged in a row direction and a column direction on a second display area of a substrate of a display device according to an embodiment. For example, a second emitting diode ED2 displaying red R, a second emitting diode ED2 displaying green G, a second emitting diode ED2 displaying blue B, and a second emitting diode ED2 displaying green G may be sequentially arranged in a first row and a third row. A second emitting diode ED2 displaying blue B, a second emitting diode ED2 displaying green G, a second emitting diode ED2 displaying R, and a second emitting diode ED2 displaying green G may be sequentially arranged in a second row.

Four second emitting diodes ED2 disposed in the first row and first column, the second row and third column, the first row and fifth column, and the second row and seventh column and displaying red R may be connected with each other. Fourth second emitting diodes ED2 disposed in the first row and second column, the first row and fourth column, the first row and sixth column, and the first row and eighth column and displaying green G may be connected with each other. Four second emitting diodes ED2 disposed in the second row and first column, the first row and third column, the second row and fifth column, and the first row and seventh column and displaying blue B may be connected with each other. Four second emitting diodes ED2 disposed in the second row and second column, the second row and fourth column, the second row and sixth column, and the second row and eighth column and displaying green G may be connected with each other. Similarly, a plurality of second emitting diodes ED2 displaying the same color among the second emitting diodes ED2 disposed in ninth to sixteenth columns may be connected with each other.

The plurality of second emitting diodes ED2 may be connected to each other by an extension wire or may be connected to each other by a pixel electrode.

A plurality of second pixel circuit portions PC2 may be arranged in a row direction and a column direction on the second display area of the substrate of the display device according to the embodiment. Each of the second pixel circuit portions PC2 may be connected with a plurality of second emitting diodes ED2. One second pixel circuit portion PC2 may be connected with two second emitting diodes ED2. For example, the second pixel circuit portions PC2 disposed in the first row and first column, the second row and third column, the first row and fifth column, and the second row and seventh column are connected with the second emitting diodes ED2 and thus may transmit the same signal R11. In addition, the second pixel circuit portion PC2 disposed in the second row and second column may be connected with the second emitting diodes ED2 disposed in the first row and second column, the first row and fourth column, the first row and sixth column, and the first row and eighth column and thus may transmit the same signal G22. In addition, the second pixel circuit portions PC2 disposed in the first row and third column may be connected with the second emitting diodes ED2 disposed in the second row and fifth column, the first row and third column, and the second row and fifth column and thus may transmit the same signal B13. In addition, the second pixel circuit portion PC2 disposed in the second row and fourth column may be connected with the second emitting diodes ED2 disposed in the second row and second column, the second row and fourth column, the second row and sixth column, and the second row and eighth column and thus may transmit the same signal G24. Similarly, each second pixel circuit portion PC2 disposed in ninth to sixteenth columns may be connected to a plurality of second emitting diodes ED2 to transmit the same signal.

For the signal transmitted to the second emitting diode ED2, a value calculated through rendering may be used. The size or disposition interval of the second emitting diodes ED2 may be similar to those of the first emitting diode. Accordingly, it is possible to prevent the boundary between the first display area DA1 and the second display area DA2 from being viewed.

Hereinafter, an image displayed on a display device according to an embodiment will be described with reference to FIG. 22 and FIG. 23.

Figure 22:
FIG. 22 shows an image displayed on a display device according to an embodiment.
Figure 23:
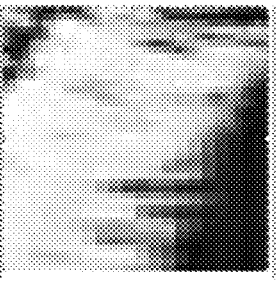
FIG. 23 is an enlarged view of some region of FIG. 22.

FIG. 22 shows an image displayed on a display device according to an embodiment, and FIG. 23 is an enlarged view of some region of FIG. 22. FIG. 22 and FIG. 23 show a case (REF) that one pixel circuit portion is connected to one emitting diode, a case (2PXL) that one pixel circuit portion is connected to two emitting diodes, a case (4PXL (vertical)) that one pixel circuit portion is connected to four adjacent emitting diodes in the vertical direction, and a case (4PXL(horizontal)) that one pixel circuit portion is connected to four adjacent emitting diode in the horizontal direction, separately. In this case, each emitting diode may have substantially the same size.

When one pixel circuit portion is connected to a plurality of emitting diodes, the resolution may be lower than when one pixel circuit portion is connected to one emitting diode. As shown in FIG. 23, when the image is enlarged, it can be seen that when one pixel circuit portion is connected to a plurality of emitting diodes, the resolution is relatively low.

As shown in FIG. 22, in a non-enlarged state, it can be seen that such a resolution difference is hardly recognized.

Hereinafter, referring to FIG. 24, an image displayed around the boundary between the first display area and the second display area of the display device according to the embodiment will be described.

Figure 24:
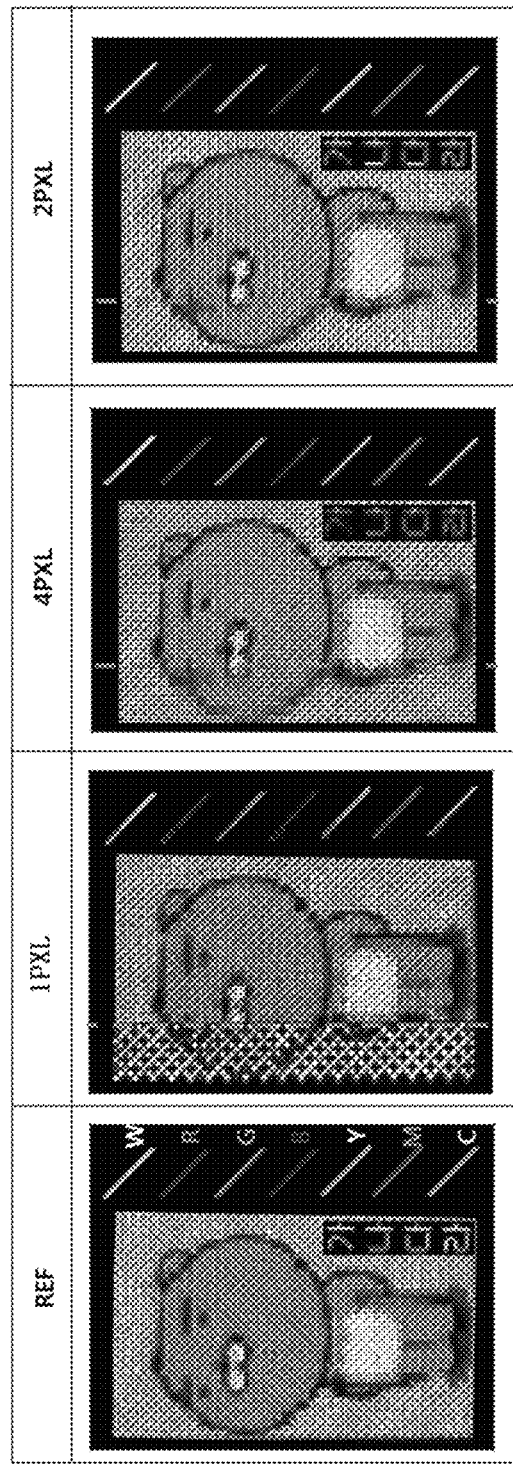
FIG. 24 shows an image displayed on the display device according to the embodiment.

FIG. 24 shows an image displayed on the display device according to the embodiment. FIG. 24 shows a case (REF) that a second display area is not included, a case (1PX) that a second pixel circuit portion is connected to one second emitting diode in the second display area and the size of the second emitting diode is relatively large, a case (4PXL) that a second pixel circuit portion is connected to four second emitting diodes in the second display area, and a case (2PXL) that a second pixel circuit portion is connected to two second emitting diodes in the second display area, separately. In FIG. 24, the red dotted line indicates the boundary between the first display area and the second display area.

As shown in FIG. 24, when one second pixel circuit portion is connected to one second emitting diode and the size of the second emitting diode is relatively large compared to a first emitting diode, the density of the second emitting diode in the second pixel area is lower than the density (number per unit area) of the first emitting diode in the first pixel area. Accordingly, a difference in resolution between the first pixel area and the second pixel area is recognized, and a boundary between the first pixel area and the second pixel area may be clearly displayed. When one second pixel circuit portion is connected to a plurality of second emitting diodes and the size of the second emitting diode is formed to correspond to that of the first emitting diode, the density of the first emitting diode in the first pixel area and the density of the first emitting diode in the second pixel area may be substantially equivalent. That is, although the number of signals applied per unit area in the second pixel area is reduced compared to the first pixel area, the density of the emitting diode is made substantially equivalent and the signal is applied through the rendering method such that a difference in the resolution of the area may not be recognized. Accordingly, the boundary between the first display area and the second display area may not be recognized.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a substrate including a first display area and a second display area;
    a first pixel circuit portion disposed on the substrate;
    a first emitting diode including a first pixel electrode connected to the first pixel circuit portion;
    a second pixel circuit portion disposed on the second display area of the substrate;
    an extension wire connected to the second pixel circuit portion;
    a second emitting diode including a second pixel electrode connected to the extension wire; and
    a driving circuit portion including a transistor connected to the first pixel circuit portion and the second pixel circuit portion, the second emitting diode overlapping the transistor in a projected view of the display device, wherein the extension wire is disposed in a different layer from the second pixel electrode.

2. The display device of claim 1, wherein
    the first emitting diode overlaps, in the projected view, the first pixel circuit portion that is connected to the first emitting diode, and
    the second emitting diode does not overlap, in the projected view, the second pixel circuit portion that is connected to the second emitting diode.

3. The display device of claim 1, wherein
    the substrate comprises:
        a display area; and
        a peripheral area surrounding the display area,
    the display area includes the first display area and the second display area, and
    the second display area is disposed between the first display area and the peripheral area.

4. The display device of claim 3, wherein
    a first part of the driving circuit portion is disposed in the second display area, and
    a second part of the driving circuit portion is disposed in the peripheral area.

5. The display device of claim 1, wherein:
    the second pixel circuit portion comprises:
        a semiconductor disposed in the second display area of the substrate;
        a gate electrode overlapping the semiconductor in the projected view;
        a source electrode and a drain electrode connected to the semiconductor; and
        a connection electrode connected to the drain electrode, and
    the extension wire is connected with the connection electrode of the second pixel circuit portion.

6. The display device of claim 5, further comprising:
    an interlayer insulating layer disposed between the connection electrode and the extension wire;
    a protective layer disposed on the extension wire and the connection electrode, the protective layer including an opening that overlaps, in the projected view, the extension wire and the connection electrode; and
    a bridge electrode disposed in the opening, the bridge electrode connecting between the extension wire and the connection electrode.

7. The display device of claim 6, wherein
    the bridge electrode is disposed in the same layer as the second pixel electrode.

8. The display device of claim 7, wherein:
    the bridge electrode is disposed in the same layer as the first pixel electrode, and
    the extension wire is disposed in a different layer from the first pixel electrode.

9. The display device of claim 6, wherein
    the interlayer insulating layer has the same planar shape as the extension wire.

10. The display device of claim 6, wherein
    the interlayer insulating layer is formed by simultaneously patterning the extension wire and the interlayer insulating layer using the same mask.

11. The display device of claim 6, wherein
    the interlayer insulating layer is disposed in the second display area, and is not disposed in the first display area.

12. The display device of claim 6, further comprising a plurality of second emitting diodes connected to the second pixel circuit portion.

13. The display device of claim 12, wherein
the plurality of second emitting diodes comprises:
   a plurality of second pixel electrodes disposed on the protective layer and connected to the extension wire;
   a plurality of emission layers respectively disposed on the plurality of second pixel electrodes; and
   a common electrode disposed on the plurality of emission layers.

14. The display device of claim 5, further comprising:
an interlayer insulating layer disposed between the connection electrode and the extension wire; and
a protective layer disposed between the extension wire and the second pixel electrode,
wherein the interlayer insulating layer is disposed on the entire substrate.

15. The display device of claim 14, wherein
the extension wire is directly connected with the connection electrode.

16. The display device of claim 14, wherein the interlayer insulating layer is disposed on the first display area and the second display area of the substrate.

17. The display device of claim 14, further comprising a plurality of second emitting diodes connected to the second pixel circuit portion.

18. The display device of claim 17, wherein
the plurality of second emitting diodes comprises:
   a plurality of second pixel electrodes disposed on the protective layer and connected to the extension wire;
   a plurality of emission layers respectively disposed on the plurality of second pixel electrodes; and
   a common electrode disposed on the plurality of emission layers.

19. The display device of claim 1, further comprising a shield electrode disposed between the second pixel circuit portion and the driving circuit portion.

20. The display device of claim 19, wherein
the shield electrode is connected to a source of constant voltage.

* * * * *